(12) United States Patent
Ohtani et al.

(10) Patent No.: US 6,307,214 B1
(45) Date of Patent: Oct. 23, 2001

(54) SEMICONDUCTOR THIN FILM AND SEMICONDUCTOR DEVICE

(75) Inventors: Hisashi Ohtani, Kanagawa; Shunpei Yamazaki, Tokyo; Jun Koyama, Kanagawa; Yasushi Ogata, Kanagawa; Akiharu Miyanaga, Kanagawa, all of (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/084,738

(22) Filed: May 27, 1998

(30) Foreign Application Priority Data

Jun. 6, 1997 (JP) .................................................. 9-165216
Apr. 3, 1998 (JP) ................................................. 10-108550
Apr. 9, 1998 (JP) ................................................. 10-114268

(51) Int. Cl.$^7$ .......................... H01L 29/04; H01L 31/20; H01L 31/036; H01L 31/0376
(52) U.S. Cl. .................... 257/59; 257/64; 257/66; 257/70; 257/627; 438/973
(58) Field of Search ................... 257/59, 66, 70, 257/64, 627; 438/973

(56) References Cited

U.S. PATENT DOCUMENTS

| | | | |
|---|---|---|---|
| 4,717,681 | 1/1988 | Curran | 438/314 |
| 4,766,477 | 8/1988 | Nakagawa et al. | 357/59 |
| 4,933,298 | * 6/1990 | Hasegawa | 437/62 |
| 5,403,772 | 4/1995 | Zhang et al. | 437/101 |
| 5,426,064 | 6/1995 | Zhang et al. | 437/40 |
| 5,481,121 | 1/1996 | Zhang et al. | 257/64 |
| 5,488,000 | 1/1996 | Zhang et al. | 437/21 |
| 5,492,843 | 2/1996 | Adachi et al. | 437/21 |
| 5,501,989 | 3/1996 | Takayama et al. | 437/21 |
| 5,508,533 | 4/1996 | Takemura | 257/64 |
| 5,529,937 | 6/1996 | Zhang et al. | 437/10 |
| 5,534,716 | 7/1996 | Takemura | 257/72 |
| 5,543,352 | 8/1996 | Ohtani et al. | 437/101 |
| 5,563,426 | 10/1996 | Zhang et al. | 257/66 |
| 5,569,610 | 10/1996 | Zhang et al. | 437/21 |
| 5,569,936 | 10/1996 | Zhang et al. | 257/66 |
| 5,580,792 | 12/1996 | Zhang et al. | 437/10 |
| 5,585,291 | 12/1996 | Ohtani et al. | 437/40 |
| 5,589,694 | 12/1996 | Takayama et al. | 257/67 |
| 5,595,923 | 1/1997 | Zhang et al. | 437/41 |
| 5,595,944 | 1/1997 | Zhang et al. | 437/41 |

(List continued on next page.)

FOREIGN PATENT DOCUMENTS

| | | |
|---|---|---|
| 57-160121 | 10/1982 | (JP) . |
| 401135014 | * 5/1989 | (JP) . |
| 7-130652 | 5/1995 | (JP) . |
| 7-135318 | 5/1995 | (JP) . |
| 7-321339 | 12/1995 | (JP) . |
| 8-78329 | 3/1996 | (JP) . |
| 8-139019 | 5/1996 | (JP) . |

OTHER PUBLICATIONS

Kakkad et al., "Low Temperature Selective Crystallization of Amorphous Silicon," *Journal of Non–Crystalline Solids*, 115, 1989, pp. 66–68, Aug. 1989.*

*Primary Examiner*—Steven Loke
(74) *Attorney, Agent, or Firm*—Eric J. Robinson; Nixon Peabody LLP

(57) ABSTRACT

After an amorphous semiconductor thin film is crystallized by utilizing a catalyst element, the catalyst element is removed by performing a heat treatment in an atmosphere containing a halogen element. A resulting crystalline semiconductor thin film has features that it exhibits {110} orientation and that almost all crystal lattices have continuity at a crystal boundary. This type of grain boundaries greatly contribute to improving the carrier mobility, and make it possible to realize semiconductor devices having very high performance.

62 Claims, 21 Drawing Sheets

U.S. PATENT DOCUMENTS

| | | | |
|---|---|---|---|
| 5,604,360 | 2/1997 | Zhang et al. | 257/72 |
| 5,605,846 | 2/1997 | Ohtani et al. | 437/21 |
| 5,606,179 | 2/1997 | Yamazaki et al. | 257/59 |
| 5,608,232 | 3/1997 | Yamazaki et al. | 257/66 |
| 5,612,250 | 3/1997 | Ohtani et al. | 437/101 |
| 5,614,426 | 3/1997 | Funada et al. | 437/40 |
| 5,614,733 | 3/1997 | Zhang et al. | 257/66 |
| 5,616,506 | 4/1997 | Takemura | 438/150 |
| 5,620,910 | 4/1997 | Teramoto | 438/151 |
| 5,621,224 | 4/1997 | Yamazaki et al. | 257/66 |
| 5,624,851 | 4/1997 | Takayama et al. | 438/166 |
| 5,637,515 | 6/1997 | Takemura | 438/162 |
| 5,639,698 | 6/1997 | Yamazaki et al. | 437/278 |
| 5,643,826 | 7/1997 | Ohtani et al. | 437/88 |
| 5,646,424 | 7/1997 | Zhang et al. | 257/66 |
| 5,648,277 | 7/1997 | Zhang et al. | 437/21 |
| 5,654,203 | 8/1997 | Ohtani et al. | 438/97 |
| 5,656,825 | 8/1997 | Kusumoto et al. | 257/66 |
| 5,663,077 | 9/1997 | Adachi et al. | 438/151 |
| 5,677,549 | 10/1997 | Takayama et al. | 257/66 |
| 5,696,386 | 12/1997 | Yamazaki | 257/57 |
| 5,696,388 | 12/1997 | Funada et al. | 257/64 |
| 5,700,333 | 12/1997 | Yamazaki et al. | 136/258 |
| 5,705,829 | 1/1998 | Miyanaga et al. | 257/66 |
| 5,712,191 | 1/1998 | Nakajima et al. | 437/174 |
| 5,744,822 | 4/1998 | Takayama et al. | 257/66 |
| 5,744,824 | 4/1998 | Kousai et al. | 257/74 |
| 5,756,364 | 5/1998 | Tanaka et al. | 437/21 |
| 5,766,977 | 6/1998 | Yamazaki | 438/151 |
| 5,773,327 | 6/1998 | Yamazaki et al. | 438/154 |
| 5,773,846 | 6/1998 | Zhang et al. | 257/66 |
| 5,773,847 | 6/1998 | Hayakawa | 257/66 |
| 5,783,468 | 7/1998 | Zhang et al. | 438/166 |
| 5,795,795 | 8/1998 | Kousai et al. | 437/174 |
| 5,808,321 | 9/1998 | Mitanaga et al. | 254/72 |
| 5,811,327 | 9/1998 | Funai et al. | 438/166 |
| 5,814,540 | 9/1998 | Takemura et al. | 438/166 |
| 5,818,076 | * 10/1998 | Zhang et al. | 257/255 |
| 5,821,138 | 10/1998 | Yamazaki et al. | 438/166 |
| 5,824,573 | 10/1998 | Zhang et al. | 438/150 |
| 5,824,574 | 10/1998 | Yamazaki et al. | 438/150 |
| 5,830,784 | 11/1998 | Zhang et al. | 438/154 |
| 5,837,619 | 11/1998 | Adachi et al. | 438/795 |
| 5,840,118 | 11/1998 | Yamazaki | 117/103 |
| 5,843,225 | 12/1998 | Takayama et al. | 117/8 |
| 5,843,833 | 12/1998 | Ohtani et al. | 438/486 |
| 5,851,862 | 12/1998 | Ohtani et al. | 438/166 |
| 5,858,823 | 1/1999 | Yamazaki et al. | 438/166 |
| 5,869,362 | 2/1999 | Ohtani | 438/166 |
| 5,869,363 | 2/1999 | Yamazaki et al. | 438/166 |
| 5,879,977 | 3/1999 | Zhang et al. | 438/166 |
| 5,882,960 | 3/1999 | Zhang et al. | 438/166 |
| 5,886,366 | 3/1999 | Yamazaki et al. | 257/59 |
| 5,888,857 | 3/1999 | Zhang et al. | 438/162 |
| 5,888,858 | 3/1999 | Yamazaki et al. | 438/162 |
| 5,897,347 | 4/1999 | Yamazaki et al. | 438/166 |
| 5,904,770 | 5/1999 | Ohtani et al. | 117/103 |
| 5,959,314 | * 9/1999 | Voutsas | 257/65 |
| 5,970,330 | * 10/1999 | Buynoski | 438/198 |

* cited by examiner 5 nm 5 nm

FIG. 8A HEAT TREATMENT FOR CRYSTALLIZATION

Addition of P-type Dopant Impurity Ion (p-/p+ Formation)

CMOS circuit | Active Matrix Circuit

Peripheral Circuit (CMOS)    Active Matrix Circuit

SEMICONDUCTOR THIN FILM AND SEMICONDUCTOR DEVICE

BACKGROUND OF THE INVENTION

1. Field of the Invention

The present invention relates to a semiconductor thin film formed on a substrate having an insulative surface and a semiconductor device using such a semiconductor thin film as its active layer. In particular, the invention relates to such a semiconductor thin film and semiconductor device in which the semiconductor thin film is made of a material having silicon as the main component.

In this specification, the term "semiconductor device" is used as including all of devices that function by utilizing a semiconductor, and specifically includes the following.

(1) Single elements such as a thin-film transistor
(2) Semiconductor circuits using a single element of item (1)
(3) Electro-optical devices using a single element of item (1) or a semiconductor circuit of item (2)
(4) Electronic devices using a semiconductor circuit of item (2) or an electro-optical device of item (3)

2. Description of the Related Art

In recent years, the techniques of forming thin-film transistors (TFTs) by using a semiconductor thin film (thickness: hundreds to thousands of angstrom) formed on a substrate having an insulative surface have attracted much attention. Thin-film transistors are commonly used in various electronic devices such as ICs and electro-optical devices, and are now being developed at high speed particularly as switching elements of an image display device.

For example, in liquid crystal display devices, it is attempted to apply TFTs to every kind of electric circuit such as a pixel matrix circuit in which pixel regions arranged in matrix form are controlled individually, a driver circuit for controlling the pixel matrix circuit, or a logic circuit (a processor circuit, a memory circuit, or the like) for processing an external data signal.

At present, TFTs using an amorphous silicon film as an active layer have been put into practical use. However, TFTs using a crystal silicon film such as a polysilicon film are necessary for electric circuits, such as a driver circuit and a logic circuit, that are required to operate at even higher speed.

For example, techniques of the present assignee that are disclosed in Japanese Unexamined Patent Publication Nos. 7-130652 and 8-78329 are known as methods for forming a crystalline silicon film on a glass substrate. The disclosure of these publications is incorporated herein by reference. By utilizing a catalyst element for accelerating crystallization of an amorphous silicon film, the techniques of these publications enable formation of a crystal silicon film having superior crystallinity by a heat treatment of 500–600° C. and about 4 hours.

In particular, the technique of the publication No. 8-78329 is such that the above technique is utilized to cause crystal growth in a direction approximately parallel with the substrate surface. The present inventors especially call a resulting crystallized region a "lateral growth region."

However, even a driver circuit that is constructed by using such TFTs cannot completely provide required performance. In particular, at present, it is impossible to construct, by using conventional TFTs, high-speed logic circuits that are required to operate at extremely high speed (megahertz to gigahertz).

To improve the crystallinity of a crystalline silicon film having grain boundaries (called a polycrystalline silicon film), the inventors have repeated trial and error as exemplified by a semi-amorphous semiconductor (Japanese Unexamined Patent Publication No. 57-160121 etc.) and a monodomain semiconductor (Japanese Unexamined Patent Publication No. 8-139019).

The concept common to the semiconductor films described in the above publications is to make grain boundaries substantially harmless. That is, the most important object was to substantially eliminate grain boundaries to thereby enable smooth movement of carriers (electrons or holes).

However, the semiconductor films described in the above publications are still insufficient to allow logic circuits to perform required high-speed operation. That is, to realize a system-on-panel incorporating logic circuits, it is necessary to develop a material that is not known, i.e., an entirely new material.

SUMMARY OF THE INVENTION

An object of the present invention is to satisfy the above requirement, that is, to provide a semiconductor thin film capable of realizing a semiconductor device having extremely high performance that allows construction of such a high-speed logic circuit as conventional TFTs cannot provide and to provide a semiconductor device using such a semiconductor thin film.

The invention provides a semiconductor thin film which is a collected body of a plurality of rod-like or flat-rod-like crystals, wherein the surface orientation is approximately equal to {110} orientation, and wherein almost all of crystal lattices have continuity at any grain boundary.

According to another aspect of the invention, there is provided a semiconductor thin film which is a collected body of a plurality of rod-like or flat-rod-like crystals, wherein the surface orientation is approximately equal to {110} orientation, and wherein almost all lattice fringes that are detected so as to traverse any grain boundary of different crystal grains extend straight and are continuous there.

The invention relates to techniques for realizing the above semiconductor thin films. Semiconductor device produced by using the above respective semiconductor thin films have the following features.

(1) At least the channel forming region is constituted of a semiconductor thin film that is a collected body of a plurality of rod-like or flat-rod-like crystals, the surface orientation of the semiconductor thin film is approximately equal to {110} orientation, and almost all of crystal lattices of the semiconductor thin film have continuity at any crystal boundary.

(2) At least the channel forming region is constituted of a semiconductor thin film that is a collected body of a plurality of rod-like or flat-rod-like crystals, the surface orientation of the semiconductor thin film is approximately equal to {110} orientation, and almost all of lattice fringes of the semiconductor thin film that are detected so as to traverse any grain boundary of different crystal grains extend straight and are continuous there.

BRIEF DESCRIPTION OF THE DRAWINGS

FIGS. 8A–8E and 9A–9D show a manufacturing process of a thin-film transistor according to a first embodiment of the present invention;

DETAILED DESCRIPTION OF THE PREFERRED EMBODIMENTS

The present invention as summarized above will be hereinafter described in detail by using embodiments.
Embodiment 1

This embodiment is directed to a manufacturing process of a semiconductor thin film according to the invention and a semiconductor device (specifically, a TFT) using the semiconductor thin film as its active layer. The manufacturing process will be described basically with reference to FIGS. 8A–8E to 9A–9D. After the description of the manufacturing process, knowledge that has been obtained in connection with the TFT of this invention and relates to its crystal structure and electrical characteristics will be described.

First, a quartz substrate 801 as a substrate having an insulative surface is prepared. A silicon substrate on which a thermal oxidation film is formed can be used instead of the quartz substrate 801. Further, it is possible to form an amorphous silicon film on a quartz substrate and then convert it into an insulating film by thermally oxidizing it completely. Still further, there may be used a quartz substrate, a ceramic substrate, or a silicon substrate on which a silicon nitride film is formed as an insulating film.

Then, an amorphous silicon film 802 is formed at such a thickness that the final thickness (i.e., a thickness after thickness reduction due to thermal oxidation) will become 10–75 nm (preferably 15–45 nm). It is important that the concentrations of impurities in the film be thoroughly managed during the film formation.

In this embodiment, the concentration of each of C (carbon), N (nitrogen), O (oxygen), and S (sulfur) that are typical impurities in the amorphous silicon film 802 is managed so as to be less than $5 \times 10^{18}$ atoms/cm$^3$ (preferably $1 \times 10^{18}$ atoms/cm$^3$ or less). If any of these impurities exists at a concentration higher than the above value, it will adversely affect the crystallization, possibly lowering the film quality after the crystallization.

Figure 23:
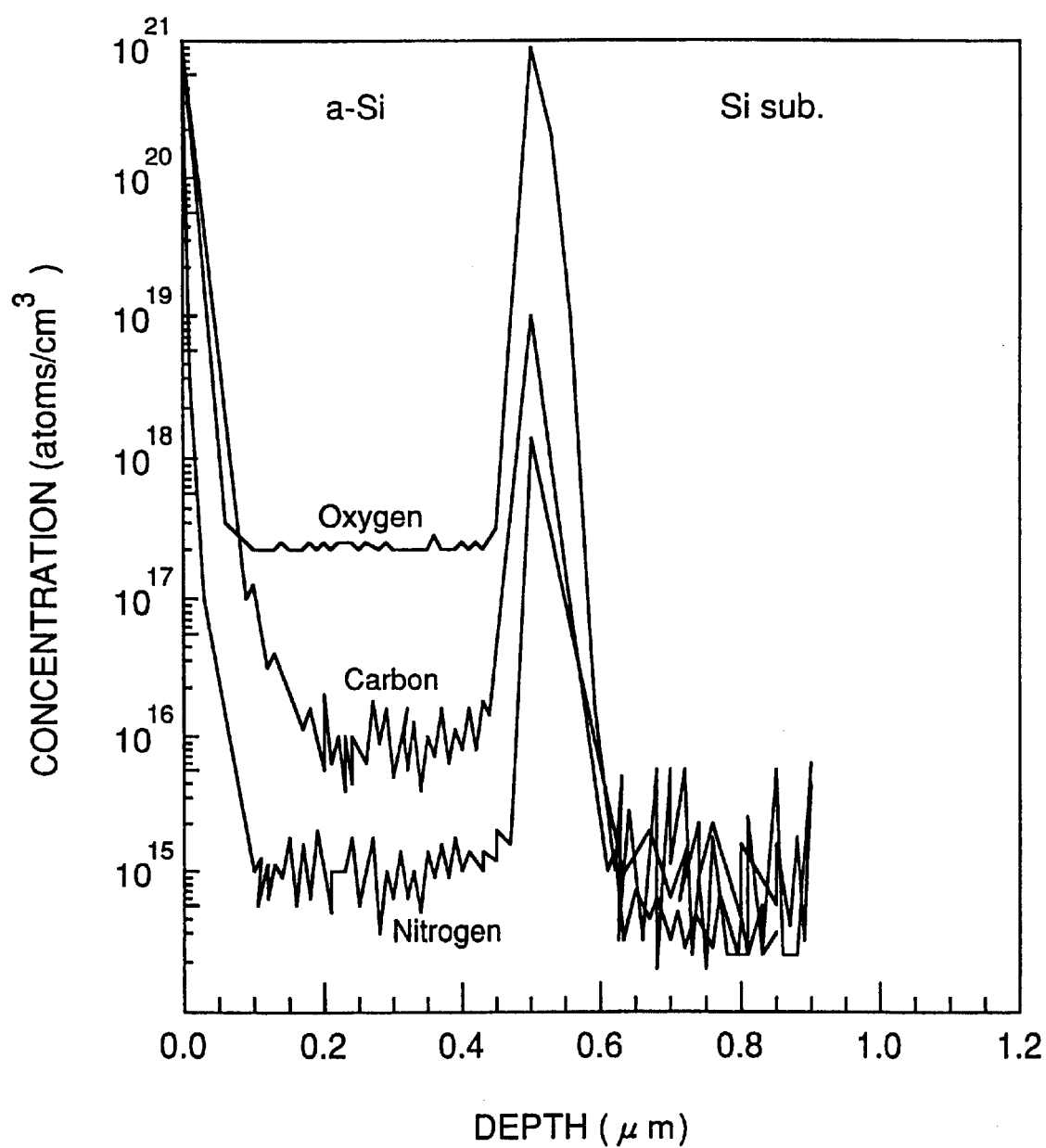
FIG. 23 is a graph showing concentration profiles of C, N, and O.

FIG. 23 shows a result of an SIMS (secondary ion mass spectroscopy) analysis in which the concentrations of impurities in an amorphous silicon film formed under the conditions of this embodiment were measured. The sample was such that a 0.5-$\mu$m-thick amorphous silicon film was formed on a silicon wafer. As seen from FIG. 23, it was confirmed that the concentrations of all of C, N, and O fell within the above ranges. It is noted that in this specification the concentration of an element in a film is defined by a minimum value in an SIMS measurement result.

To make the concentrations of all of C, N, and O fall within the above ranges, it is desirable that a low-pressure CVD furnace used in this embodiment be subjected to dry cleaning on a regular basis to keep its film forming chamber clean. The dry cleaning may be performed by causing a ClF$_3$ (chlorine fluoride) gas to flow at 100–300 sccm through the furnace that is heated to about 200–400° C. and cleaning the film forming chamber by fluorine that is generated by thermal decomposition.

According to knowledge of the inventors, deposits (mostly made of materials having silicon as the main component) of about 2 $\mu$m in thickness can be removed completely in 4 hours when the intrafurance temperature is set at 300° C. and the flow rate of a ClF$_3$ gas is set at 300 sccm.

The concentration of hydrogen in the amorphous silicon film 802 is also a very important parameter; a film of better crystallinity appears to be obtained by making the hydrogen content smaller. Therefore, it is preferable that the amorphous silicon film 802 be formed by low-pressure CVD. It is possible to use plasma CVD by optimizing the film forming conditions.

Then, a step of crystallizing the amorphous silicon film 802 is executed by using the technique developed by the inventors that is disclosed in Japanese Unexamined Patent Publication No. 7-130652, the entire disclosure of which is incorporated herein by reference. Although either of techniques described in the first and second embodiments of this publication may be used, as far as the present invention is concerned, use of the technique of the second embodiment (described in detail in Japanese Unexamined Patent Publication No. 8-78329) is preferable.

According to the technique described in the publication No. 878329, first a mask insulating film 803 for selecting a catalyst element adding region is formed. The mask insulating film 803 has a plurality of openings through which a catalyst element is to be added. The position of a crystal region can be determined by that of the openings.

Then, an Ni containing layer 804 is formed by applying, by spin coating, a solution containing nickel (Ni) as a catalyst element for accelerating crystallization of the amorphous silicon film 802 (see FIG. 8A). Examples of usable catalyst elements other than nickel are cobalt (Co), iron (Fe), palladium (Pd), platinum (Pt), copper (Cu), gold (Au), and germanium (Ge).

The method of adding the catalyst element may also be ion implantation or plasma doping each of which uses a resist mask. These techniques are effective in constructing miniaturized circuits because the reduction of the area occupied by the catalyst element adding region and the control of the growth length of a lateral growth region can be made easier.

After the catalyst element adding step has finished, hydrogen removal is performed at 450° C. for 1 hour and then the amorphous silicon film 802 is crystallized by performing a heat treatment at 500–700° C. (typically 550–650° C.) for 4–24 hours in an inert atmosphere or an oxygen atmosphere. In this embodiment, a heat treatment is performed at 570° C. for 14 hours in a nitrogen atmosphere.

Figure 8B:
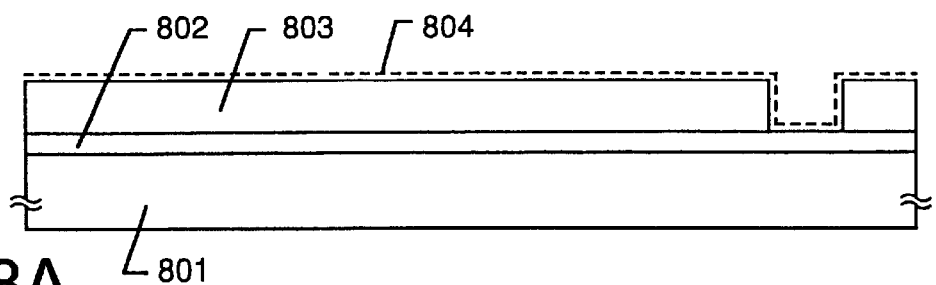
Figure 8B:
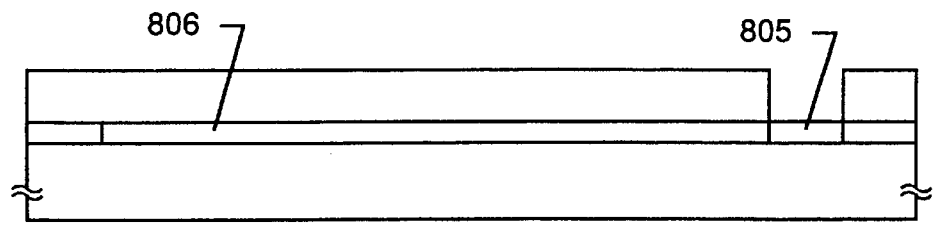

At this time, the crystallization of the amorphous silicon film 802 proceeds with priority from nuclei occurring in a nickel-added region 805 and a crystal region 806 is formed as a result of growth that is approximately parallel with the surface of the substrate 801 (see FIG. 8B). The inventors call the crystal region 806 a lateral growth region. The lateral growth region is advantageous in having superior crystallinity as a whole because it is a collection of crystals having generally equal crystallinity.

A region that can be called a lateral growth region is formed microscopically also in the case where the technique described in the first embodiment of the above-mentioned publication No. 7-130652. However, this technique has a problem in the controllability of grain boundaries because nuclei occur non-uniformly in a plane.

After the heat treatment for crystallization has finished, the mask insulating film 803 is removed and then patterning is performed to form an island-like semiconductor layer (active layer) 807 all of which is constituted of part of the lateral growth region 806.

Then, a gate insulating film 808 is formed that is an insulating film containing silicon. The thickness of the gate insulating film 808 may be adjusted in a range of 20–250 nm in terms of the thickness after being increased in a later thermal oxidation step. The film forming method may be a known vapor-phase method (plasma CVD, sputtering, or the like).

Figure 8C:
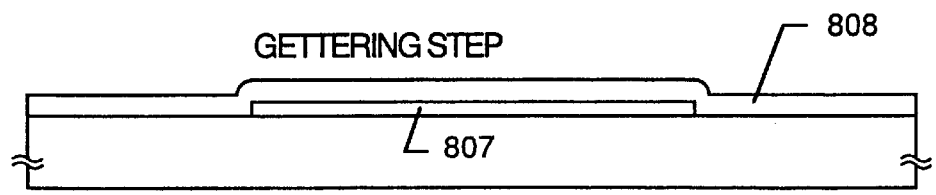

Then, as shown in FIG. 8C, a heat treatment (catalyst element gettering process) is performed to remove or reduce the concentration of the catalyst element (nickel). In this heat treatment, a halogen element is included in the processing atmosphere to utilize the metal element gettering effect of the halogen element.

To fully effectuate the gettering effect of the halogen element, it is preferable to perform the heat treatment at a temperature higher than 700° C. At 700° C. or less, there is a possibility that the halogen compound in the processing atmosphere is hardly decomposed and the gettering effect is not obtained.

In view of this, the heat treatment is performed at a temperature higher than 700° C., preferably at 800–1,000° C. (typically 950° C.), and the processing time is set at 0.1–6 hours (typically 0.5–1 hour).

In this embodiment, a heat treatment is performed at 950° C. for 30 minutes in an atmosphere containing hydrogen chloride (HCl) at 0.5–10 vol % (in this embodiment, 3 vol %) with respect to an oxygen atmosphere. A HCl density higher than the above range is not preferable because asperities whose depth or height is equivalent to the thickness of the active layer 807 are formed.

Other than HCl, one or plural kinds of compounds selected from typical halogen-element-inclusive compounds including HF, $NF_3$, HBr, $Cl_2$, $ClF_3$, $BCl_3$, $F_2$, and $Br_2$ may also be used.

In this step, it is considered that nickel in the active layer 807 is gettered through the action of chlorine and removed into the air in the form of nickel chloride which is volatile. After the execution of this step, the concentration of nickel in the active layer 807 is decreased to $5 \times 10^{17}$ atoms/cm$^3$ or less.

The value $5 \times 10^{17}$ atoms/cm$^3$ is the lower detection limit of SIMS. In an analysis of TFTs that were experimentally produced by the inventors, no influences of nickel on the TFT characteristics were found when the nickel concentration was $1 \times 10^{18}$ atoms/cm$^3$ or less (preferably $5 \times 10^{17}$ atoms/cm$^3$ or less). In this specification, the impurity concentration is defined by a minimum value in an SIMS measurement result.

In the above heat treatment, thermal oxidation reaction proceeds at the interface between the active layer 807 and the gate insulating film 808, whereby the thickness of the gate insulating film 808 increases as much as the thickness of a resulting thermal oxidation film. By forming a thermal oxidation film in this manner, a semiconductor/insulating film interface with a very small number of interface states can be obtained. The heat treatment also provides an effect that a failure in the thermal oxidation film formation at the ends of the active layer 807 (edge thinning) can be prevented.

It is also effective to improve the film quality of the gate insulating film 808 by performing a heat treatment at 950° C. for about 1 hour in a nitrogen atmosphere after the above heat treatment in a halogen atmosphere.

It was found by an SIMS analysis that the halogen element that was used in the gettering treatment remained in the active layer 807 at a concentration of $1 \times 10^{15}$ to $1 \times 10^{20}$ atoms/cm$^3$. It was also found by an SIMS analysis that the halogen element existed at a high concentration between the active layer 807 and the thermal oxidation film formed by the heat treatment.

As for other elements, an SIMS analysis revealed that the concentrations of typical impurities of C, N, O, and S were less than $5 \times 10^{18}$ atoms/cm$^3$ (typically $1 \times 10^{18}$ atoms/cm$^3$ or less).

Figure 8D:
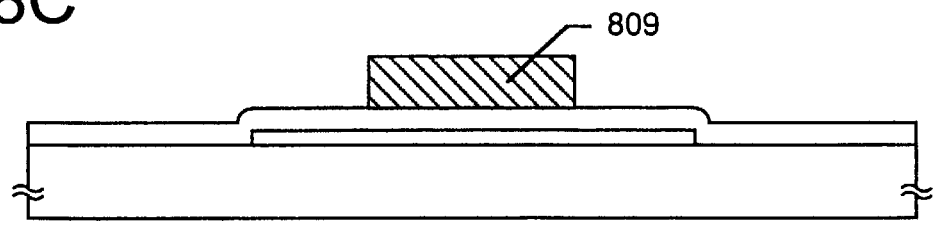

Thereafter, a metal film (not shown) having aluminum as the main component is formed and then patterned into a gate electrode starting member 809 (see FIG. 8D). In this embodiment, an aluminum film containing scandium at 2 wt % is formed. Other than an aluminum film, a tantalum film, a conductive silicon film, etc. may also be used.

At this stage, a technique of the inventors that is disclosed in Japanese Unexamined Patent Publication No. 7-135318 is used, the entire disclosure of which is incorporated herein by reference. This publication discloses a technique of forming source and drain regions and low-concentration impurity regions in a self-aligned manner by using an oxide film formed by anodization.

First, in a state that a resist mask (not shown) that was used for patterning the aluminum film is left as it is, anodization is performed in a 3%-aqueous solution of oxalic acid, whereby a porous anodic oxide film 810 is formed.

The thickness of the porous anodic oxide film 810 increases as the anodization time. Since the resist mask remains on the top surface, the porous anodic oxide film 810 is formed on only the side faces of the gate electrode starting member 809. According to the technique of the publication No. 7-135318, this film thickness corresponds to the length of low-concentration impurity regions (one of which is called an LDD region). In this embodiment, the anodization is performed under such conditions that the film thickness becomes 700 nm.

Then, after the resist mask (not shown) is removed, anodization is performed in an electrolyte obtained by mixing tartaric acid (3%) into an ethylene glycol solution. As a result, a dense, non-porous anodic oxide film 811 is formed. Since the electrolyte permeates the porous anodic oxide film 810, the anodic oxide film 811 is also formed inside the porous anodic oxide film 810.

The thickness of the non-porous anodic oxide film 811 is determined in accordance with the application voltage. In this embodiment, the anodization is performed with an application voltage of 80 V to provide a film thickness of about 100 nm.

An aluminum film 812 that remains after the above two anodization steps will substantially serve as a gate electrode.

Figure 8E:
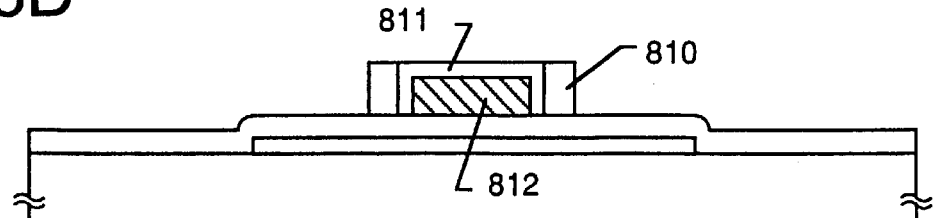

After the state of FIG. 8E has been obtained in the above manner, the gate insulating film 808 is etched by dry etching by using the gate electrode 812 and the porous anodic oxide film 810 as a mask. The porous anodic oxide film 810 is then removed. The end portions of a resulting gate insulating film 813 project by the thickness of the porous anodic oxide film 810 (see FIG. 9A).

Then, a step of adding an impurity element for imparting one conductivity type is performed. The impurity element may be P (phosphorus) or As (arsenic) for n-type conductivity and B (boron) for p-type conductivity.

In this step, first impurity addition is performed at a high acceleration voltage to form n⁻ regions 814 and 815. Because the acceleration voltage is as high as about 80 kV, the impurity element is added to not only the exposed portions of the active layer but also the portions of the active layer located under the exposed end portions of the gate insulating film 813 (see FIG. 9B). Adjustments are made so that the n⁻ regions 814 and 815 have an impurity concentration of $1 \times 10^{18}$ to $1 \times 10^{19}$ atoms/cm³.

Second impurity addition is then performed at a low acceleration voltage to form n⁺ regions 816 and 817. Because the acceleration voltage is as low as about 10 kV, the gate insulating film 813 serves as a mask (see FIG. 9C). Adjustments are made so that the n⁺ regions 816 and 817 have a sheet resistance of 500Ω or less (preferably 300Ω or less).

Among the impurity regions formed by the above step, the n⁺ regions become a source region 816 and a drain region 817 and the n⁻ regions become low-concentration impurity regions 818. Since the impurity element is not added to the portion of the active layer right under the gate electrode 813, this portion becomes a substantially intrinsic channel forming region 819.

Having an effect of weakening a strong electric field developing between the channel forming region 819 and the drain region 817, the low-concentration impurity region 818 is called an LDD (lightly doped drain) region.

After the active layer has been completed in the above manner, the impurity element is activated by a combination of furnace annealing, laser annealing, lamp annealing, etc. At the same time, damage of the active layer caused in the impurity element adding step is repaired.

Then, a 500-nm-thick interlayer insulating film 820 is formed, which may be a silicon oxide film, a silicon nitride film, a silicon oxynitride film, an organic resin film, or a multilayered film thereof.

Polyimide, acrylic, polyamide, polyimideamide, or the like may be used as an organic resin film material. The use of an organic resin film is advantageous in the following points. For example, (1) a film can be formed easily, (2) a thick film can be formed easily, (3) the parasitic capacitance can be reduced because of its small relative permittivity, and (4) the flatness is high.

Then, after contact holes are formed, a source electrode 821 and a drain electrode 822 are formed. Finally, the entire device is hydrogenated by heating the entire substrate at 350° C. for 1–2 hours in a hydrogen atmosphere, whereby dangling bonds in the films (particularly in the active layer) are terminated.

Figure 9A:
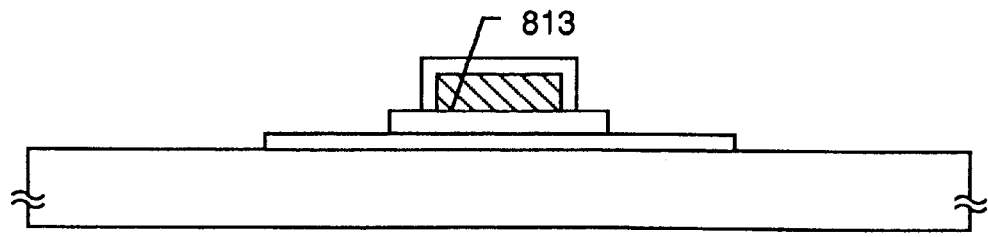
Figure 9B:
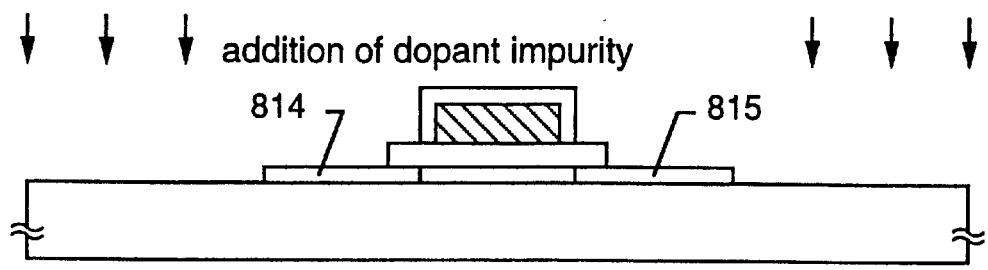
Figure 9C:
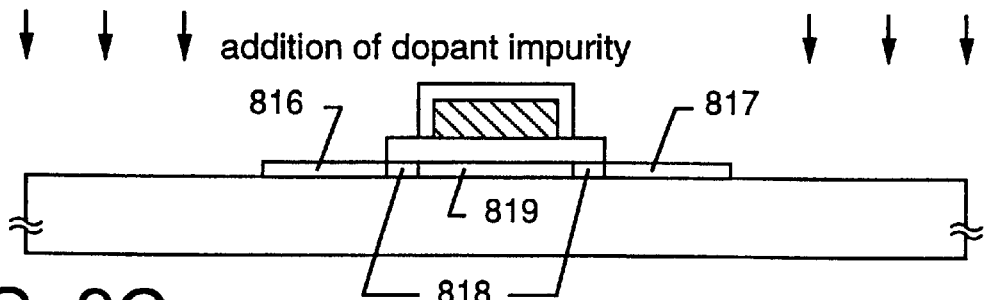
Figure 9D:
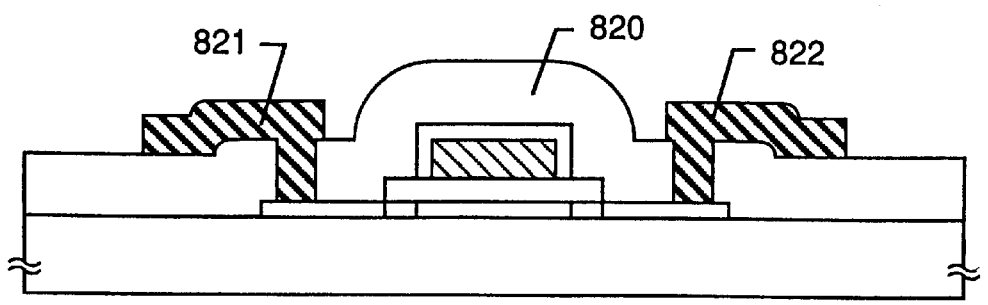

A TFT having a structure shown in FIG. 9D is thus manufactured. The features of the thus-manufactured TFT will be described below.

Knowledge Relating to Crystal Structure of Active Layer

Microscopically, an active layer formed by the above manufacturing process has a crystal structure in which a plurality of rod-like or flat-rod-like crystals are arranged approximately parallel with each other with such regularity that they are directed to a particular direction. This can easily be confirmed by an observation by a TEM (transmission electron microscope) method.

Figure 1A:
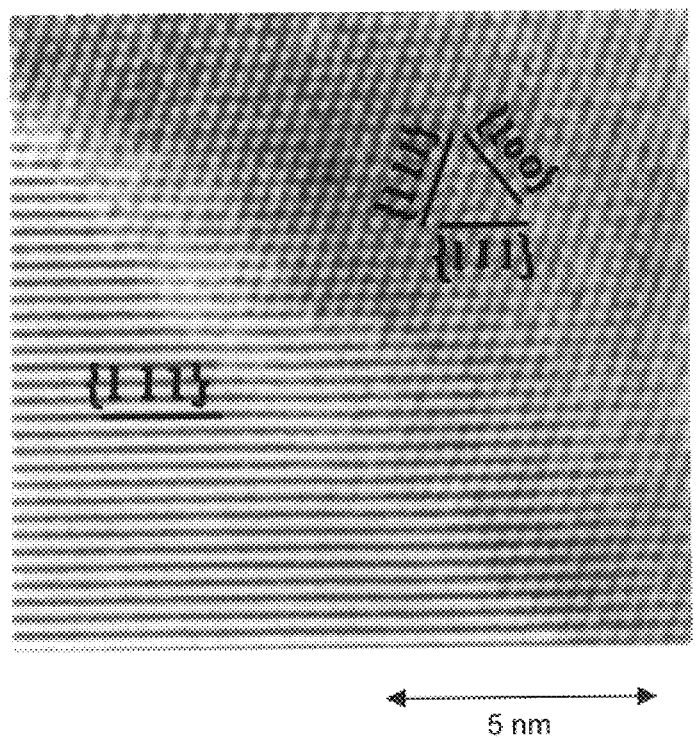
FIGS. 1A and 1B are HR-TEM photographs of enlarged crystal grains of semiconductor films.

FIG. 1A is a HR-TEM (high-resolution transmission electron microscope) photograph with a magnification factor of eight million of a grain boundary between rod-like or flat-rod-like crystals. In this specification, the grain boundary is defined as one that is formed at an interface where rod-like or flat-rod-like crystals contact each other, and is hence distinguished from a macroscopic grain boundary that is formed through collision of lateral growth regions.

The above-mentioned HR-TEM method is a technique in which an electron beam is vertically applied to a sample and an arrangement of atoms or molecules is evaluated by utilizing interference among transmitted electrons or elastically scattered electrons.

In the HR-TEM method, an arrangement state of crystal lattices can be detected as a lattice fringe. Therefore, by observing grain boundaries, a bonding state of atoms at grain boundaries can be estimated. Although a lattice fringe appears like black and white stripes, such stripes are caused by a difference in contrast and do not indicate atom positions.

FIG. 1A is a typical HR-TEM photograph of a crystalline silicon film obtained by the invention, and shows a state that two different crystal grains contact each other at a grain boundary running top-left to bottom-right. The two crystal grains approximately had {110} orientation though there was a small difference between their crystal axes.

As described later, an examination of a plurality of crystal grains by electron beam diffraction revealed that almost all crystal grains approximately had {110} orientation.

Many crystal grains examined should have had a (011) surface and a (101) surface and these equivalent surfaces are together represented by a {110} surface. This will be briefly described with reference to FIGS. 2A–2C.

Figure 2A:
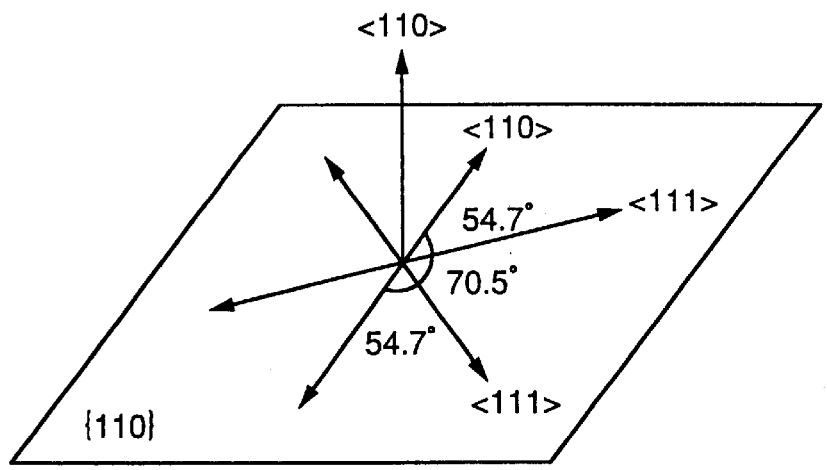
FIGS. 2A–2C schematically show directional relationships of a crystal.

FIG. 2A schematically shows a crystal grain whose crystal surface is a {110} plane (the crystal axis is <110>). A {110} crystal surface includes a <111> axis, a <100> axis, etc.

Figure 2B:
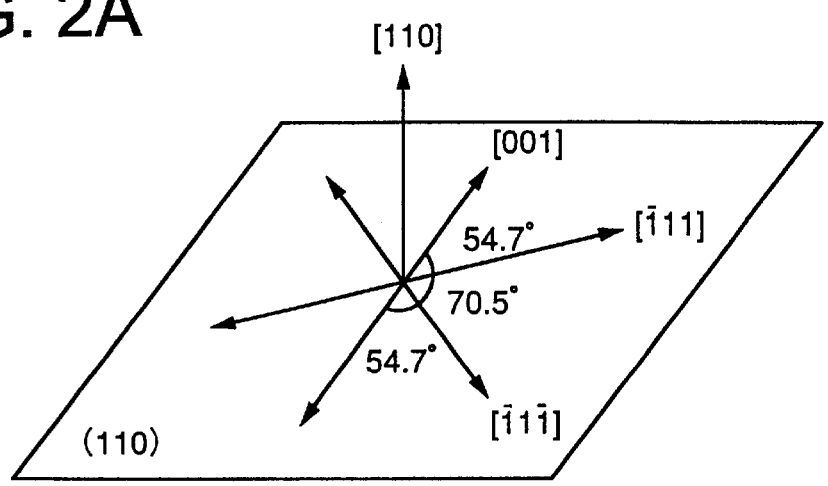
Figure 2C:
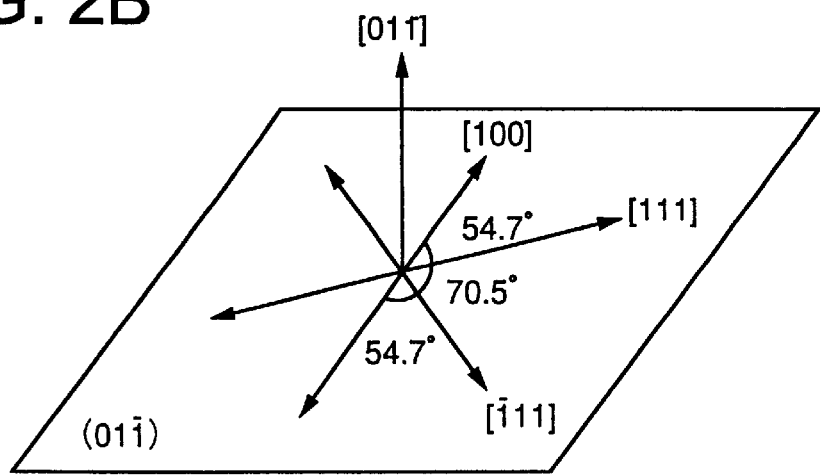

The notation of FIG. 2A is an example of an index notation based on a set theory. FIGS. 2B and 2C show examples which employ a strict index notation. For example, crystal axes [110] and [01-1] are equivalent to each other and are together represented by <110>.

The notation such as [01–1] is employed in this specification for convenience of description, the sign "-" is used instead of a logical symbol representing inversion.

Since a discussion using strict crystal directions (crystal axes) may lead to various ways of understanding as exemplified above, the index notation based on a set theory will be employed in the following description, which will also serve to simplify the description. It goes without saying that the same physical properties are obtained in all the equivalent crystal surfaces.

Incidentally, as shown in FIG. 1A, lattice fringes corresponding to the {111} and {100} planes are found in the surface. The phrase "a lattice fringe corresponding to the {111} plane" means a lattice fringe in which a {111} surface appears as a cross-section obtained by cutting a crystal grain along the lattice fringe. What plane a lattice fringe corresponds to can be easily checked based on intervals of the lattice fringes (simplified method).

A plurality of lattice fringes that run vertically, horizontally, and obliquely are found for the top crystal grain of FIG. 1A, while only one lattice fringe is found for the bottom crystal grain. This is considered due to an influence of the electron beam application direction during the TEM observation. That is, as for the top crystal grain, an electron beam is applied vertically to the crystal surface and hence a plurality of lattice fringes were detected in the surface. On the other hand, since the bottom crystal grain is slightly inclined from the top crystal grain, an electron beam is not applied vertically to the bottom crystal grain, to allow only a particular lattice fringe to be detected.

Attention is now paid to the lattice fringes corresponding to the {111} plane. As seen from FIG. 1A, one of the two lattice fringes of the top crystal grain corresponding to the {111} plane is parallel with the lattice fringe of the bottom crystal grain corresponding to the {111} plane.

The lattice fringes of the two different crystal grains are connected to each other so as to traverse the grain boundary irrespective of the presence of the grain boundary. That is, most of the stripes that traverse the grain boundary extend straightly and continuously though they belong to the different crystal grains. This is true for arbitrarily selected grain boundaries. Ninety percent or more (preferably 95% or more) of all lattice fringes have continuity at grain boundaries.

This type of crystal structure is the most remarkable feature of a crystalline silicon film of the invention, and is a crystal structure capable of realizing the grain boundary that the inventors have desired to obtain.

This type of crystal structure (more correctly, a grain boundary structure) indicates that the two different crystal grains are joined to each other at the grain boundary with an extremely high degree of matching. That is, crystal lattices are continuously connected to each other at the grain boundaries and trap states due to crystal defects etc. are far less prone to occur. In other words, crystal lattices have continuity at the grain boundaries.

Figure 1B:
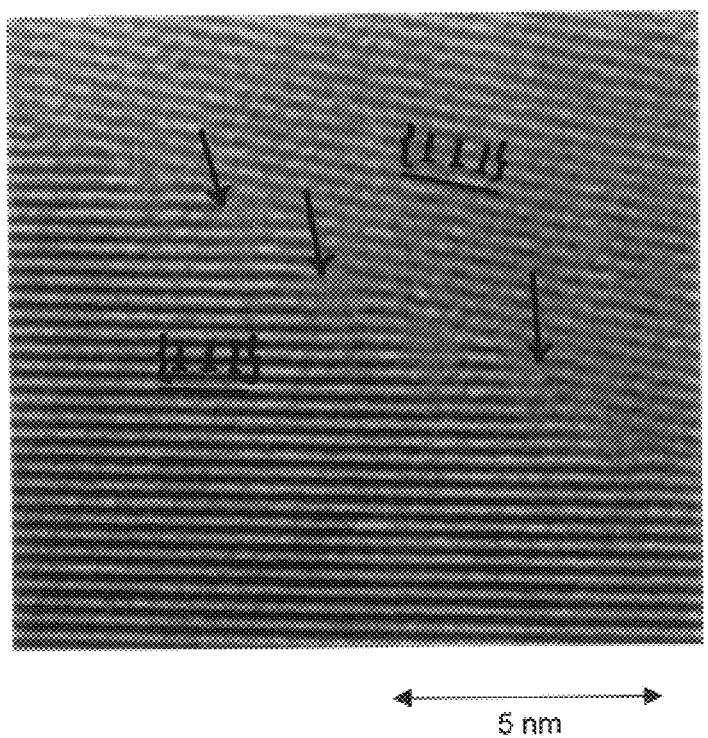

For reference, a HR-TEM photograph of a conventional high-temperature polysilicon film is shown in FIG. 1B. In the case of FIG. 1B, as described later, the crystal surface did not have any regularity and crystal grains did not have such orientation as dominated by the {110} plane. However, for comparison with FIG. 1A, crystal grains having a lattice fringe corresponding to the {111} plane were observed.

In FIG. 1B, only one lattice fringe is found for each of the top and bottom crystal grains. This is because of the above-described reason. A measurement of the intervals of the lattice fringes according to the same method as described above revealed that each of the lattice fringes of the top and bottom crystal grains corresponds to the {111} plane as shown in FIG. 1B.

However, the two lattice fringes are not parallel with each other as seen from FIG. 1B, and hence the crystal structure of this sample is clearly different from that of the sample of FIG. 1A.

Further, as indicated by arrows in FIG. 1B, many stripes end at the grain boundary. Since dangling bonds (regarded as crystal defects) would exist at such positions, it is highly possible that trap states formed there obstruct the carrier movement.

As described above, in the crystalline silicon film of the invention, lattices are continuous at grain boundaries and no crystal defects of the above kind were found. This also evidences that the crystalline silicon film of the invention is a semiconductor film that is clearly different from the conventional high-temperature polysilicon film.

Figure 3A:
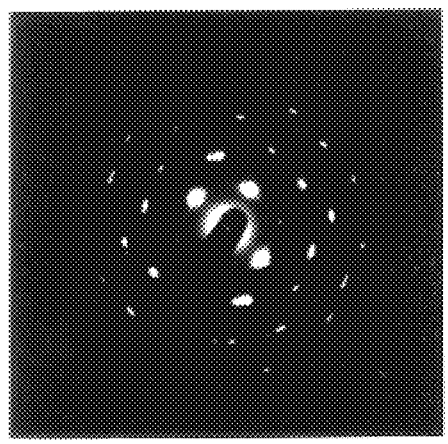
FIGS. 3A–3C are photographs and a schematic drawing each showing an electron beam diffraction pattern.
Figure 3B:
Figure 3C:
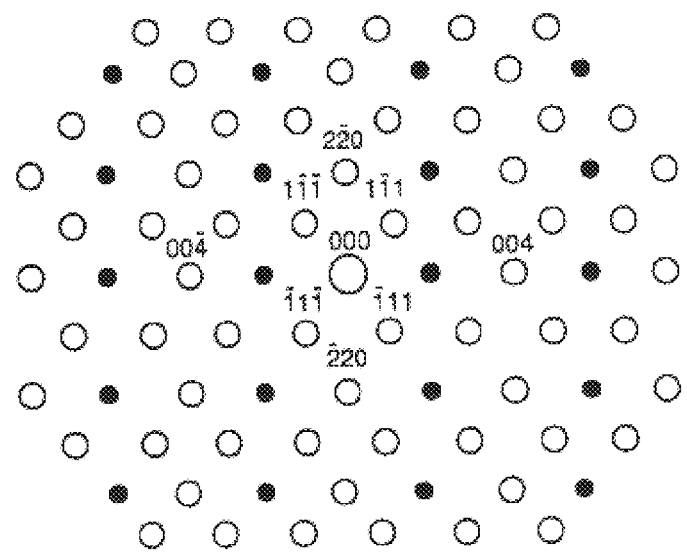

FIGS. 3A–3C show the results of an examination of a crystalline silicon film of the invention by an electron beam diffraction. FIG. 3A shows a typical electron beam diffraction pattern of a crystalline silicon film of the invention, and FIG. 3B shows a typical electron beam diffraction pattern of a conventional high-temperature polysilicon film as a reference.

Since the measurements were conducted with the diameter of an electron beam irradiation spot set at 1.35 $\mu$m, FIGS. 3A and 3B can be regarded as having sufficiently macroscopic information as compared with information of the lattice fringe level.

FIG. 3C is an electron beam diffraction pattern that will be obtained when an electron beam is applied vertically to a {110} surface of the single crystal silicon. Usually, the orientation of an observed sample is estimated by comparing such an electron beam diffraction pattern and an observation result.

In the case of FIG. 3A, diffraction spots corresponding to <110> incidence as shown in FIG. 3C appear relatively clearly and it is confirmed that the crystal axis is a <110> axis (the crystal surface is a {110} surface).

Respective diffraction spots have slight spreads on concentric circle, which is considered due to a certain distribution of the rotation angle around the crystal axis. From the patterns of the respective diffraction spots, the degree of spread is estimated to be within 5°.

Among many diffraction patterns observed are ones having a portion where no diffraction spots exist (also FIG. 3A has a portion where no diffraction spots exist). This is probably explained as follows. A part of a diffraction pattern is not detected because a sample approximately has {110} orientation but its crystal axis is slightly deviated from the <110> axis.

Based on the fact that a crystal surface almost always includes a {111} plane, the inventors infer that the above partial absence of diffraction spots is caused by a deviation in the rotation angle around the <111> axis.

On the other hand, in the case of the electron beam diffraction pattern of FIG. 3B, diffraction spots do not have clear regularity and are oriented almost randomly; in other words, it is considered that crystals having various kinds of plane orientation other than the {110} orientation are mixed in an irregular manner.

As indicated by the above observation results, the crystalline silicon film of the invention has features that almost all crystal grains approximately have the {110} orientation and that lattices have continuity at grain boundaries. These features are absent in the conventional polysilicon film.

The reason why almost all crystal grains approximately have the {110} orientation is inferred as follows from the disclosure of Japanese Unexamined Patent Publication No. 7-321339 of the inventors, the entire disclosure of which is incorporated herein by reference.

It was confirmed from TEM photographs that when an amorphous silicon film is crystallized, rod-like or flat-rod-like crystals (also called needle-like or columnar crystals) that grow approximately parallel with the substrate have a <111> axis as a growth direction. This is schematically illustrated in FIG. 20.

Where an amorphous silicon film is crystallized by using Ni as a catalyst element, crystal growth proceeds in the <111> axis direction with $NiSi_2$ precipitations serving as intermediaries. This is considered due to the fact that in the crystal surfaces of $NiSi_2$ and Si, {111} planes have such structures as to provide a high level of matching.

Figure 20:
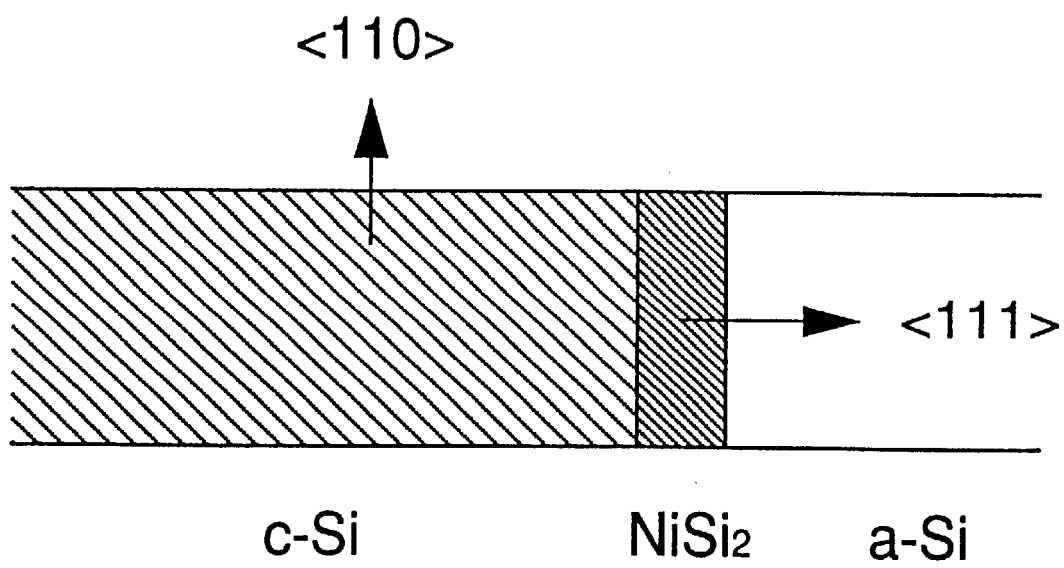
FIG. 20 schematically illustrates how crystal growth proceeds.

Since the inside of a rod-like or flat-rod-like crystal grown can substantially be regarded as a single crystal, it is indicated as c-Si (crystal silicon) in FIG. 20.

Although various kinds of planes can be formed on the side surfaces (i.e., the surfaces parallel with the growth direction) of a rod-like or a flat-rod-like crystal that has grown in the <111> axis direction, the {110} plane is most likely to appear. This is considered due to the fact that the {110} plane has the largest atom density among the planes that can be formed on the side surfaces.

For the above reason, in a crystal grain that has grown with a {111} surface as its head as is the case of the invention (i.e., a crystal grain that has grown in the <111> axis direction), a {110} plane appears as a surface (i.e., an observation surface).

The inventors conducted X-ray diffraction measurements according to the method described in the publication No. 7-321339 (the disclosure thereof is incorporated herein by reference) and calculated orientation ratios of crystalline silicon films of the invention. This publication defines the orientation ratio by a calculation method that is expressed by Equation (1):

{220} orientation existence ratio=1 (constant)

{111} orientation existence ratio=(relative intensity of {111} of a sample to {220})/(relative intensity of {111} of a powder to {220})

{311} orientation existence ratio=(relative intensity of {311} of a sample to {220})/(relative intensity of {311} of a powder to {220})

{220} orientation ratio={220} orientation existence ratio/({220} orientation existence ratio+{111} orientation existence ratio+ {311} orientation existence ratio)

Although crystal surfaces were detected as the {220} plane in the measurements, naturally it is equivalent to the {110} plane. The measurements revealed that the {110} plane was the main orientation plane and the orientation ratio was 0.7 or more (typically 0.9 or more).

As described above, the crystalline silicon film of the invention has the crystal structure that is entirely different from that of the conventional polysilicon film, based on which it can be said that the crystalline silicon film of the invention is an entirely new semiconductor film.

In forming a semiconductor thin film according to the invention, the annealing step (in this embodiment, the step of FIG. 8C) that is performed at a temperature equal to or higher than the crystallization temperature plays an important role in reducing defects in crystal grains. This will be described below.

Figure 21A:
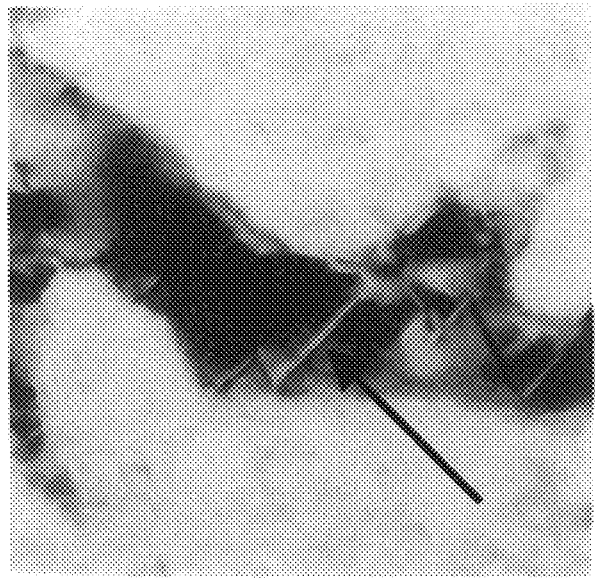
FIGS. 21A and 21B are TEM photographs showing crystal grains of crystal silicon films.

FIG. 21A is a TEM photograph with a magnification factor of 250 thousand of a crystal silicon film at the time point when the crystallization step of FIG. 8B has finished. A zigzagged defect (indicated by an arrow) is found in crystal grains (black and white portions appear due to a difference in contrast).

Although the defect of this type is mainly a stacking fault caused by erroneous stacking order of atoms in silicon lattice planes, it may be a dislocation or some other defect.

The defect of FIG. 21A appears to be a stacking fault having a defect surface parallel with the {111} plane, as judged from the fact that the zigzagged defect is bent at about 70°.

Figure 21B:
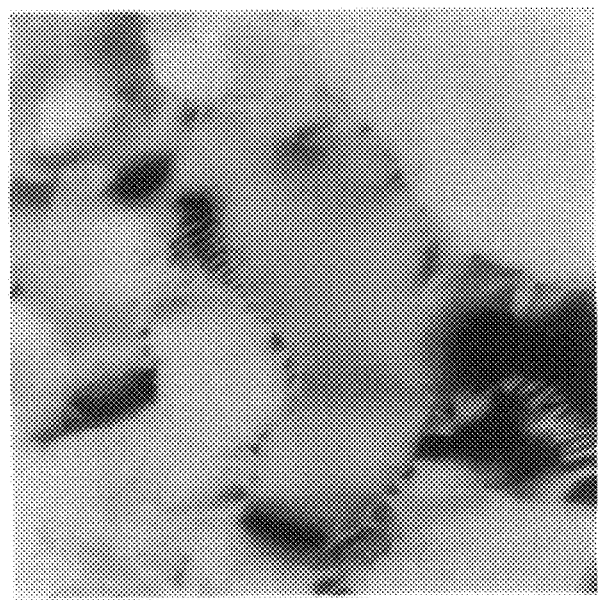

On the other hand, as shown in FIG. 21B, a crystal silicon film of the invention that is viewed with the same magnification factor has almost no defects of stacking faults, dislocations, etc. in crystal grains and hence has very high crystallinity. This tendency holds over the entire film surface. Although it is currently difficult to make the number of defects zero, it is possible to decrease it to such a level as can substantially be regarded as zero.

That is, the crystal silicon film of FIG. 21B can be considered a single crystal or so considered substantially because the number of defects in crystal grains is reduced to an almost negligible level and grain boundaries never become barriers against carrier movement by virtue of their high continuity.

As described above, although the crystal silicon films shown in the photographs of FIGS. 21A and 21B are approximately the same in continuity, they are much different in the number of defects in crystal grains. The fact that the crystal silicon film of the invention exhibits far superior electrical characteristics to the crystal silicon film of FIG. 21A is largely due to the difference in the number of defects.

From the above discussions, it is understood that the step of FIG. 8C is indispensable for the invention. The present assignee assumes the following model for phenomena occurring in this step.

First, in the state of FIG. 21A, atoms of the catalyst element (typically, nickel) are segregated at defects (mainly stacking faults) in crystal grains. That is, it is considered that there exist many Si—Ni—Si type bonds.

When the catalyst element gettering process is executed, Ni atoms existing at defects are removed and Si—Ni bonds are disconnected. Excess bonds of Si atoms immediately form Si—Si bonds to establish a stable state. The defects disappear in this manner.

It is known that defects in a crystal silicon film disappear when high-temperature thermal annealing is performed. It is inferred that in the invention the silicon recombination occurs more smoothly because many dangling bonds are generated by disconnection of Si—Ni bonds.

Further, it is considered that excess silicon atoms that are generated at the same time when the crystal silicon film is thermally oxidized move to defects and greatly contribute to formation of Si—Si bonds. This is known as the same notion as explains why a high-temperature polysilicon film has only a small number of defects in crystal grains.

The present assignee also assumes a model that the heat treatment at a temperature (typically 700–1,100° C.) higher than the crystallization temperature causes the crystal silicon film to be fixed to the underlying surface to improve the adhesion there, which in turn causes defects to disappear.

The crystal silicon film and the silicon oxide film as the undercoat film are different from each other in thermal expansion coefficient by a factor a little smaller than 10. Therefore, after the amorphous silicon film has been converted into the crystal silicon film (see FIG. 21A), very strong stress is imposed on the crystal silicon film during its cooling.

Figure 22A:
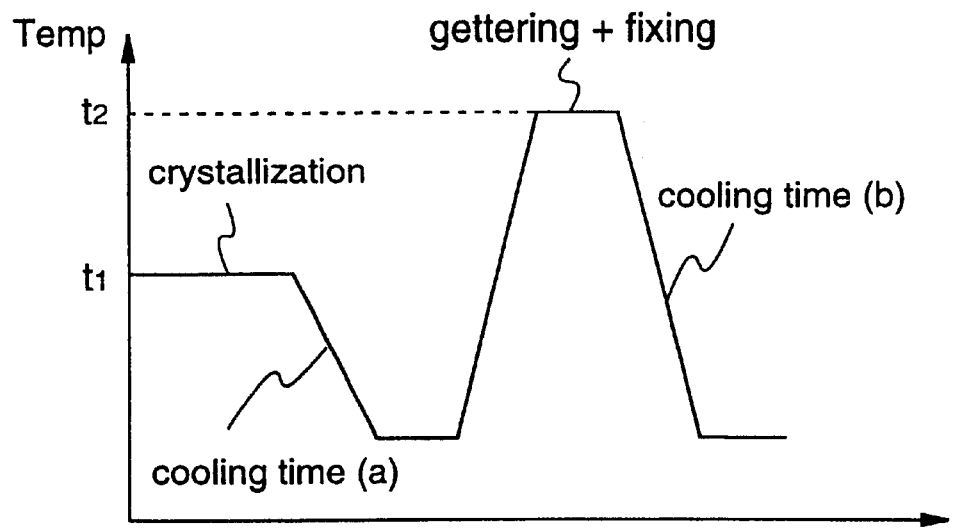
FIGS. 22A–22C illustrate a model relating to generation and disappearance of defects.

This will be explained below with reference to FIGS. 22A–22C. FIG. 22A shows a heat history to which a crystal silicon film is subjected after the crystallization step. First, a crystal silicon film that has been crystallized at a temperature $t_1$ is cooled to the room temperature in a cooling period (a).

Figure 22B:
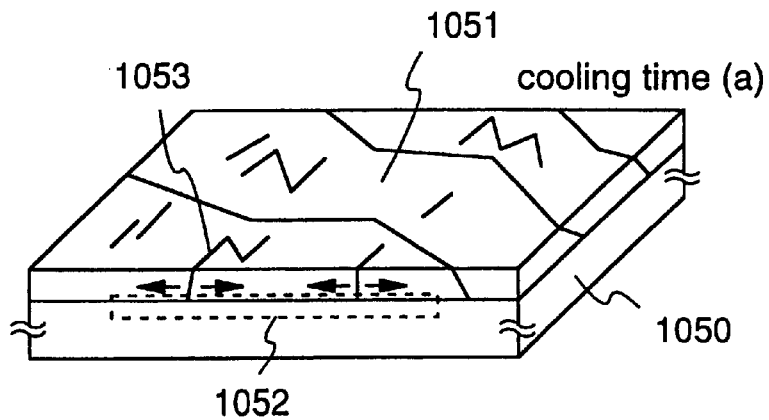
Figure 22C:
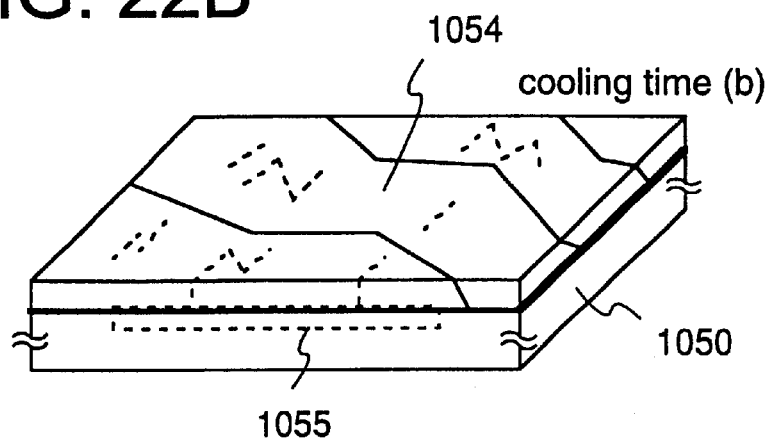

FIG. 22B shows the crystal silicon film that is in the midst of the cooling period (a). Reference numerals 1050 and 1051 denote a quartz substrate and a crystal silicon film, respectively. At this stage, it is considered that the adhesion between the crystal silicon film 1051 and the quartz substrate 1050 at an interface 1052 is not high, as a result of which many intragrain defects occur.

That is, it is considered that the crystal silicon film 1051 that is given tension due to the difference in thermal expansion coefficient is very prone to move on the quartz substrate 1050 and defects 1053 such as stacking faults and dislocations are easily caused by such force as tensile stress.

The crystal silicon film that is obtained in the above manner is in the state of FIG. 21 A. Thereafter, the catalyst element gettering step is executed at a temperature $t_2$ as shown in FIG. 22A, whereby the defects in the crystal silicon film disappear for the above-described reasons.

In this step, it is an important point that in the catalyst element gettering step the crystal silicon film is fixed to the quartz substrate 1050 to improve the adhesion with it. That is, the gettering step also serves as a step of fixing the crystal silicon film to the quartz substrate 1050 (underlying member).

After the completion of the gettering and fixing step, the crystal silicon film is cooled to the room temperature in a cooling period (b). In contrast to the case of the cooling period (a) after the crystallization step, in the cooling step (b) an interface 1055 between the quartz substrate 1050 and the annealed crystal silicon film 1054 is in a state of very high adhesion (see FIG. 22C).

Where the adhesion is so high, the crystal silicon film 1054 is completely fixed to the quartz substrate 1050 and hence stress that is imposed on the crystal silicon film 1054 in the cooling period (b) does not cause defects. That is, it can be prevented that defects are generated again.

Although FIG. 22A shows the process in which the temperature is reduced to the room temperature after the crystallization step, the gettering and fixing step may be performed by increasing the temperature immediately after the completion of the crystallization step. Such a process can also produce a crystal silicon film of the invention.

The crystal silicon film of the invention obtained in the above manner (see FIG. 21B) has a feature that the number of defects in crystal grains is much smaller than in the crystal silicon film as subjected to the crystallization step (see FIG. 21A).

In an electron spin resonance (ESR) analysis, the difference in the number of defects appears as a difference in spin density. At present, it has become apparent that the spin density of a crystal silicon film of the invention is at most $5 \times 10^{17}$ spins/cm$^3$ or less (preferably $3 \times 10^{17}$ spins/cm$^3$ or less). However, since this measurement value is close to the detection limit of the currently available measuring instruments, it is considered that the actual spin density is even lower.

The crystal silicon film of the invention having the above crystal structure and features is called a continuous grain silicon (CGS) film.

Knowledge Relating to Electrical Characteristics of TFT

Figure 4:
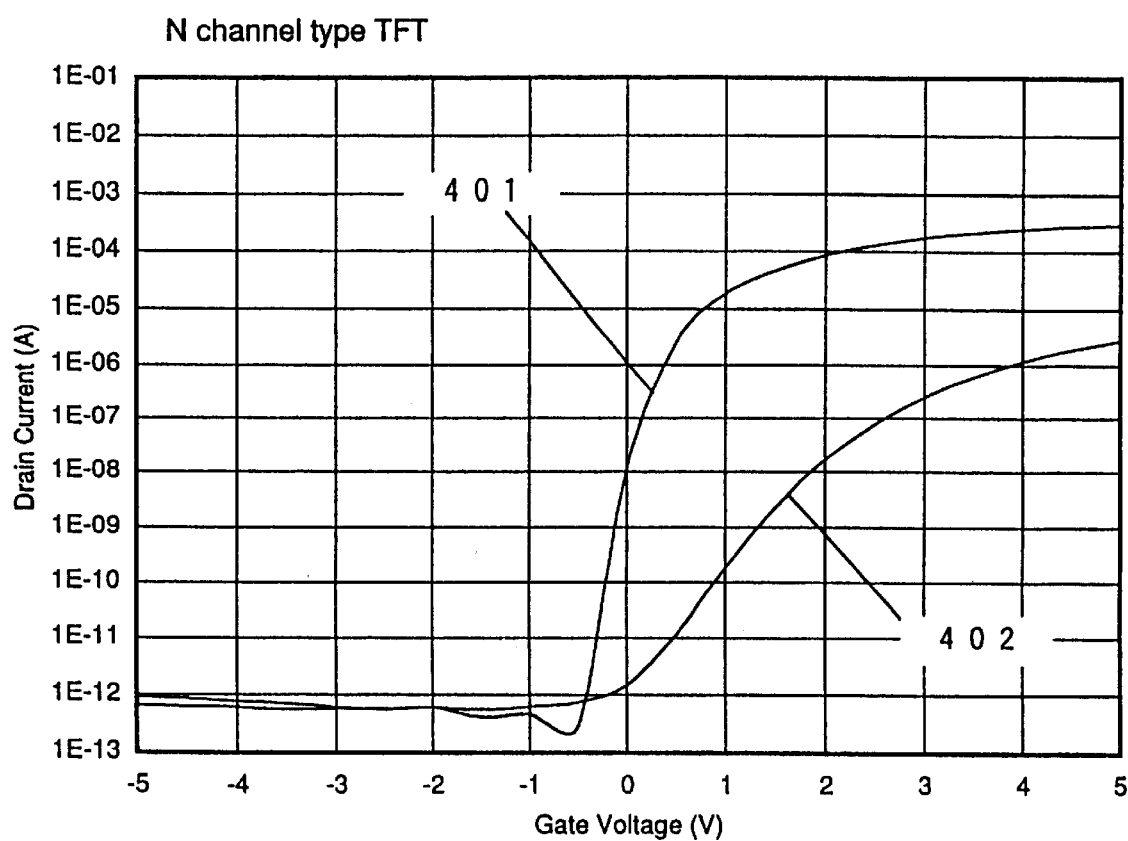
FIG. 4 is a graph showing an electrical characteristic of a thin film transistor.

A TFT manufactured by using, as its active layer, a crystalline silicon film that is formed in the above-described manner exhibits an electrical characteristic as shown in FIG. 4. FIG. 4 shows Id-Vg curves (Id-Vg characteristics) of n-channel TFTs plotted in such a manner that the horizontal axis represents the gate voltage Vg and the vertical axis represents the logarithm of the drain current Id. The electrical characteristic was measured by using an instrument on the market (type name 4145B produced by Hewlett-Packard Co.).

In FIG. 4, reference numerals 401 and 402 denote electrical characteristics of a TFT using an active layer that is formed by the above-described process and a conventional TFT, respectively. The conventional TFT is a TFT that is not subjected to the heat treatment (gettering process) after the formation of a gate insulating film in the first embodiment.

A comparison between the two transistor characteristics shows that even at the same gate voltages the on-current of the characteristic 401 is two to four orders larger than that of the characteristic 402. The on current means a drain current that flows when a TFT is in an on state (the gate voltage is approximately in a range of 0 to 5 V in FIG. 4).

It is also seen that the subthreshold characteristic of the characteristic 401 is superior to that of the characteristic 402. The subthreshold characteristic is a parameter indicating the quickness of the switching operation of a TFT, and it is better as the Id-Vg curve rises or falls more steeply when a TFT is switched to an on or an off state.

Typical electrical characteristics of a TFT that is produced according to the invention was as follows:

(1) For each of an n-type TFT and a p-type TFT, the subthreshold coefficient that is a parameter indicating the switching performance (quickness of switching between on and off operations) of a TFT is as small as 60–100 mV/decade (typically 60–85 mV/decade). This data value is approximately equal to that of an insulated-gate field-effect transistor (IGFET) using a single crystal silicon.

(2) The field-effect mobility ($\mu_{FE}$) that is a parameter indicating the operation speed of a TFT is as large as 200–650 cm$^2$/Vs (n-type TFT; typically 250–300 cm$^2$/Vs) or as large as 100–300 cm$^2$/Vs (p-type TFT; typically 150–200 cm$^2$/Vs).

(3) The threshold voltage ($V_{th}$) that is a parameter roughly indicating the drive voltage of a TFT is as small as –0.5 to 1.5 V (n-type TFT) or as small as –1.5 to 0.5 V (p-type TFT). This means that a TFT can be driven by a small power supply voltage and hence the power consumption can be reduced.

As described above, a TFT produced according to the invention has a far superior switching characteristic and high-speed operation characteristic.

Characteristics of Circuit Constituted of TFTs of Invention

Next, a description will be made of frequency characteristics of ring oscillators that were constructed by the inventors by using TFTs that were produced according to the invention. The ring oscillator is a circuit in which odd-numbered stages of inverter circuits having a MOS structure are connected to each other in a ring-like manner, and is used for determining the delay time per one-stage inverter circuit. The ring oscillators that were used in experiments had the following configuration:

Number of stages: Nine

Thickness of gate insulating film of TFT: 30 nm and 50 nm

Gate length of TFT: 0.6 μm

Figure 5:
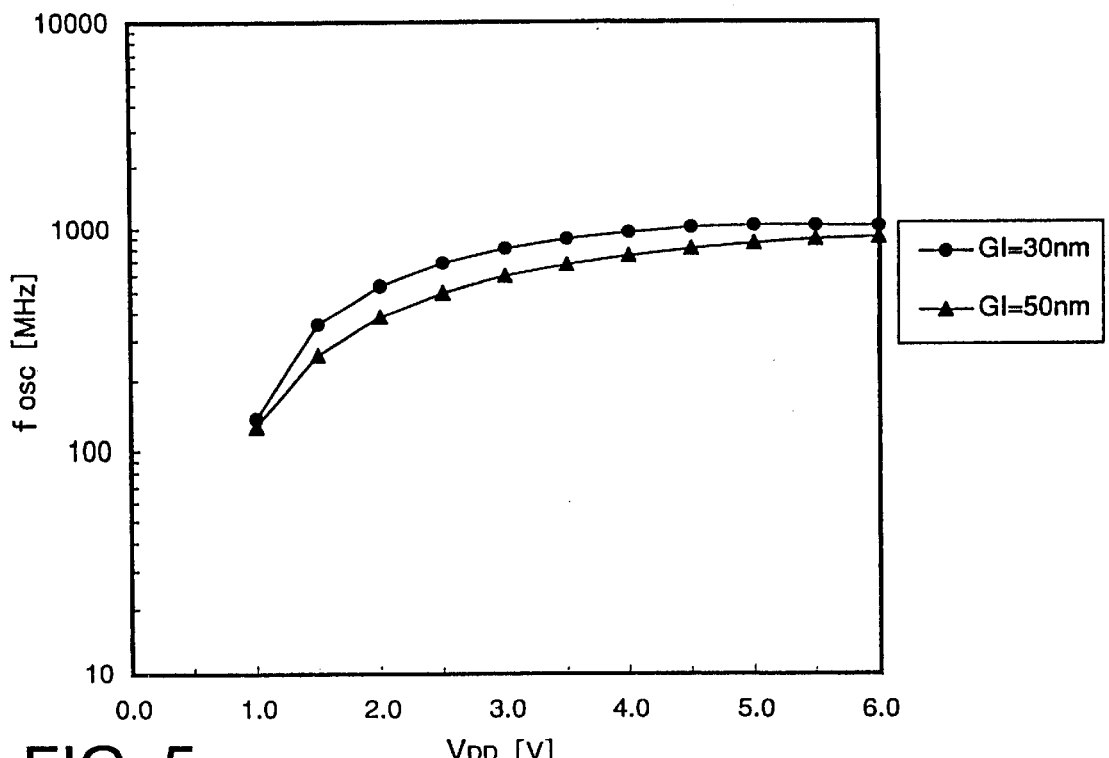
FIG. 5 is a graph showing frequency characteristics of ring oscillators.

FIG. 5 shows the results of an experiment in which oscillation frequencies of the ring oscillators were measured with a spectrum analyzer when the power supply voltage was 5 V. In FIG. 5, the horizontal axis represents the power supply voltage VDD and the vertical axis represents the oscillation frequency $f_{osc}$. As seen from FIG. 5, an oscillation frequency higher than 1 GHz was realized when TFTs having a 30-nm-thick gate insulating film were used.

Figure 6:
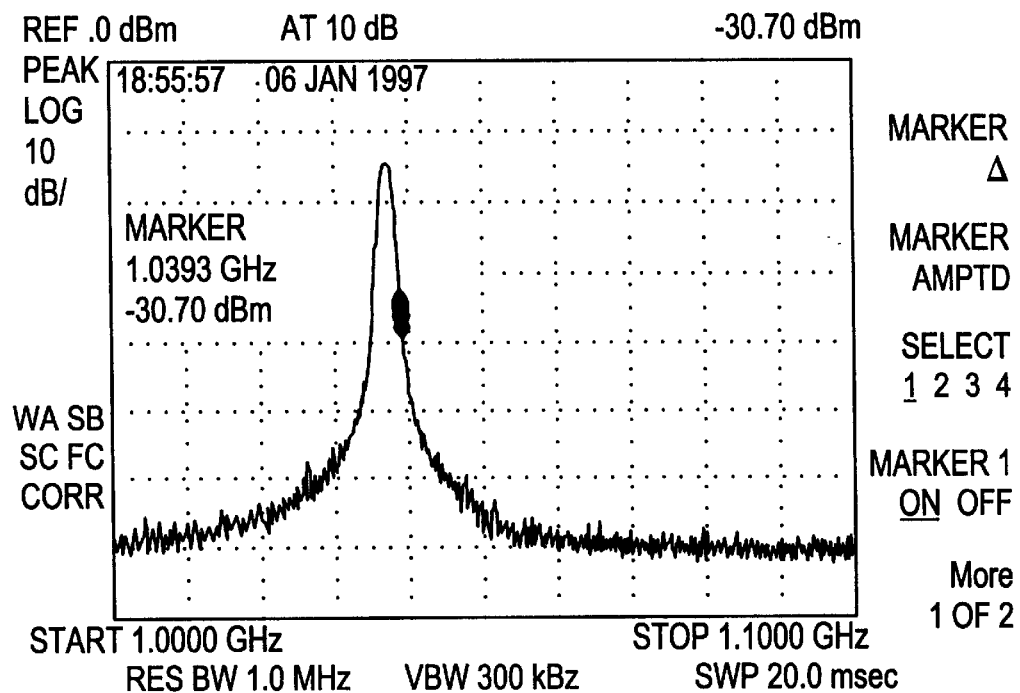
FIG. 6 is a photograph showing an output spectrum of a ring oscillator.

FIG. 6 shows an output spectrum of the spectrum analyzer when an oscillation frequency of 1.04 GHz was obtained. The horizontal axis represents the frequency (1–1.1 GHz) and the vertical axis represents the voltage (output amplitude) on the logarithm scale. As seen from FIG. 6, the output spectrum has a peak at about 1.04 GHz. A tail of the output spectrum is due to the resolution of the instrument and does not influences experimental results.

A shift register, which is one of TEGs of LSI circuits, was actually produced and its operation frequency was checked. Output pulses of an operation frequency 100 MHz were obtained by a shift register circuit in which the thickness of a gate insulating film was 30 nm, the gate length was 0.6 μm, the power supply voltage was 5 V, and the number of stages is 50.

The above surprising data of the ring oscillators and the shift register indicate that the performance of the TFT of the invention is equivalent to or even surpasses that of the IGFET using a single crystal silicon.

Figure 7:
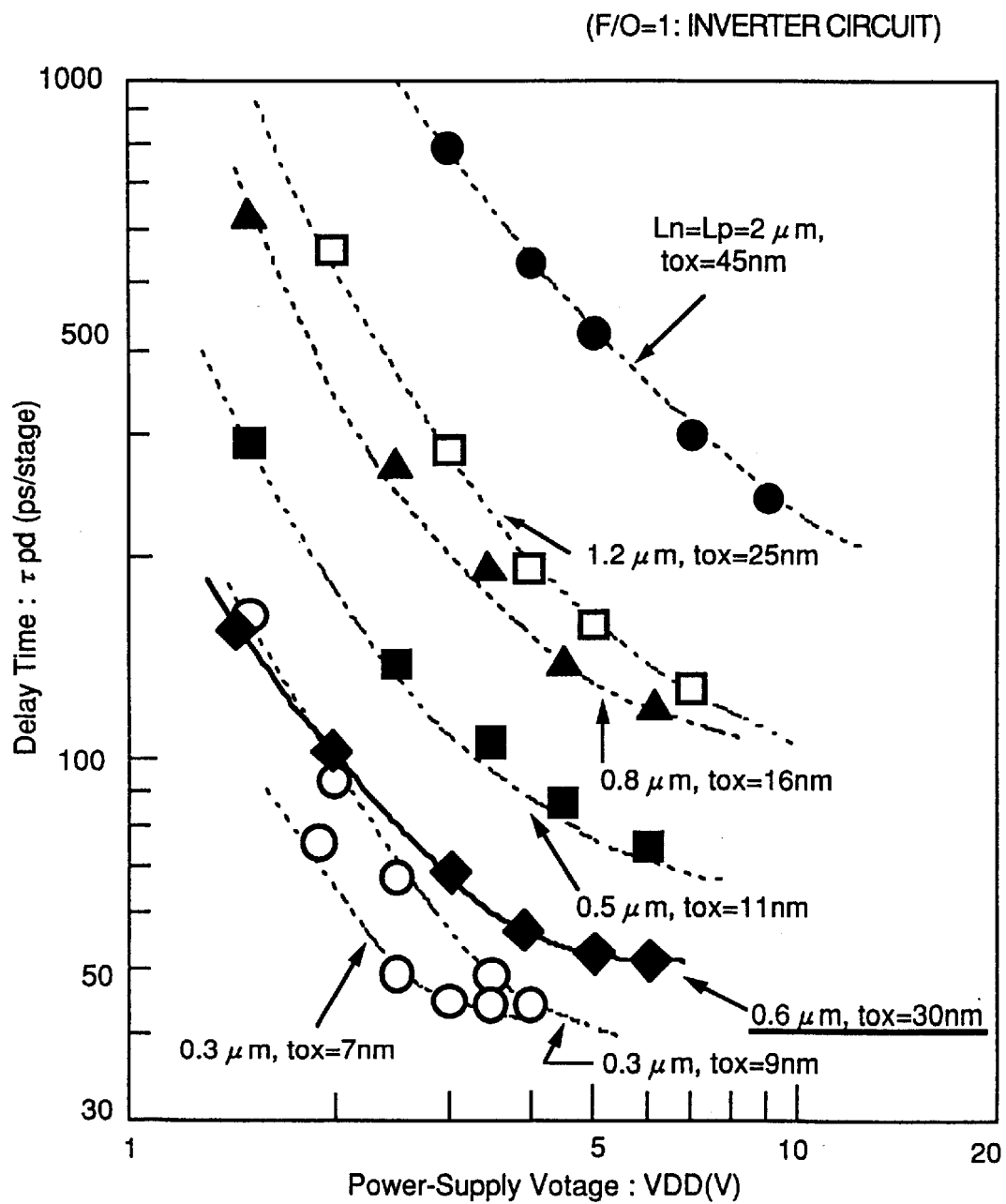
FIG. 7 is a graph showing a scaling rule.

The following data evidences the above estimation. FIG. 7 is a graph of data in which the horizontal axis represents the power supply voltage $V_{DD}$ and the vertical axis represents the delay time $\tau_{pd}$ per stage of inverters of F/O (fan-out ratio)=1 (from Kenji Maeguchi et al., "Revolution of Logic LSI Technology,"p. 108, Science Forum Corp., 1995).

Various curves (indicated by broken lines) in FIG. 7 represent data that were obtained with IGFETs using a single crystal silicon by various design rules, and indicate what is called a scaling rule.

A solid-line curve shown in FIG. 7 is obtained when a relationship between the delay time and the power supply voltage of an inverter that was obtained by using the above-described ring oscillator is applied to FIG. 7. Attention should be paid to the fact that the performance of the inverter produced by using TFTs in which the channel length is 0.6 μm and the thickness $t_{ox}$ of a gate insulating film is 30 nm is superior to that of the inverter produced by using IGFETs in which the channel length is 0.5 μgm and the thickness $t_{ox}$ of a gate insulating film is 11 nm.

This clearly shows that the performance of the TFT according to the invention is superior to that of the IGFET. For example, even if the gate insulating film of the TFT of the invention is made three times or more thicker than that of the IGFET, the performance of the former is equivalent or even superior to that of the latter. That is, it can be said that the TFT of the invention has a higher breakdown voltage than the IGFET having equivalent characteristics.

Further, it is possible to realize even superior performance by miniaturizing the TFT of the invention according to the scaling rule. For example, it is expected based on the scaling rule that a ring oscillator produced according to a 0.2-μm rule will attain an operation frequency of 9 GHz (because the operation frequency f is in inverse proportion to the square of the channel length L).

As described above, it has been confirmed that the TFT of the invention has the superior characteristics and is an entirely new TFT that allows a semiconductor circuit using it to perform high-speed operation of 10 GHz or more.

Embodiment 2

While the first embodiment is directed to the case of using a silicon film as a semiconductor film, it is also effective to use a silicon film containing germanium at 1–10%, which is expressed by $Si_XGe_{1-X}$ (0<X<1; preferably 0.9≦X≦0.99).

By using such a compound semiconductor film, the threshold voltage can be made small when an n-type or a p-type TFT is manufactured. Further, the field-effect mobility can be increased.

Embodiment 3

In the first embodiment, no impurity is intentionally added to the active layer and hence the channel forming region is intrinsic or substantially intrinsic. The term "substantially intrinsic" means a state that satisfies one of the following conditions: (1) the activation energy of a silicon film is about ½ of the band gap (i.e., the Fermi level is located approximately at the center of the forbidden band), (2) the impurity concentration is lower than the spin density, and (3) no impurity is added intentionally.

However, it is possible to utilize a known channel doping technique in producing a TFT according to the invention. The channel doping technique is a technique for adding an impurity to at least a channel forming region to control the threshold voltage.

In the invention, an impurity may be added at a very low concentration because the threshold voltage is very small originally. The fact that the concentration of an added impurity can be very low is much preferable because the threshold voltage can be controlled without reducing the carrier mobility.

Embodiment 4

This embodiment is directed to a case of obtaining the gettering effect of a phosphorus element in addition to that of a halogen element (first embodiment). This embodiment will be described with reference to FIGS. 10A–10E.

First, the steps to the gettering process by a halogen element of the first embodiment are executed to obtain the state of FIG. 8C. Then, a gate electrode 11 made of tantalum or a material having tantalum as the main component is formed.

Figure 10A:
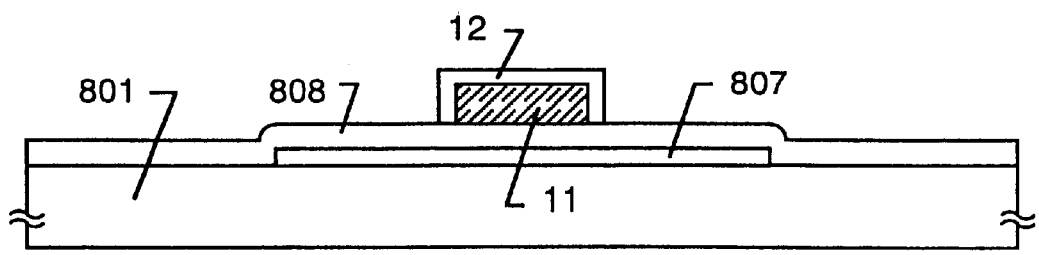
FIGS. 10A–10E show a manufacturing process of a thin-film transistor according to a fourth embodiment of the invention.
Figure 10B:
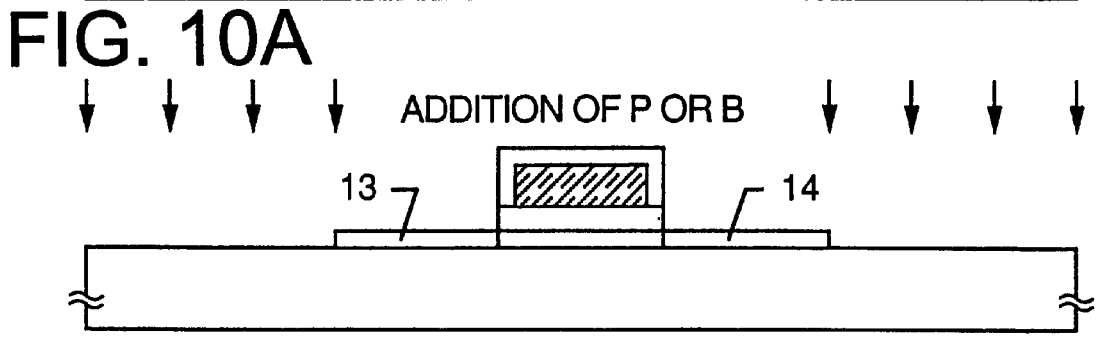

Then, anodic oxide film 12 is formed by anodizing the surface of the gate electrode 11 (see FIG. 10A). The anodic oxide film 12 serves as a protective film.

Then, the gate insulating film 808 is etched by dry etching with the gate electrode 11 used as a mask. In this state, impurity regions 13 and 14 are formed by adding phosphorus or arsenic by ion implantation (see FIG. 10B).

Then, after a thick silicon nitride film is formed, etch back is performed by dry etching, to form sidewalls 15. Thereafter, a source region 16 and a drain region 17 are formed by again adding phosphorus or arsenic ions (see FIG. 10C).

The second addition of phosphorus is not effected in the portions under the sidewalls 15, and hence those portions become a pair of low-concentration impurity regions 18 containing phosphorus at a lower concentration than the source region 16 and the drain region 17. The portion under the gate electrode 11 becomes a channel forming region 19 that is intrinsic or substantially intrinsic or contains a very small amount of impurity for threshold voltage control.

Figure 10C:
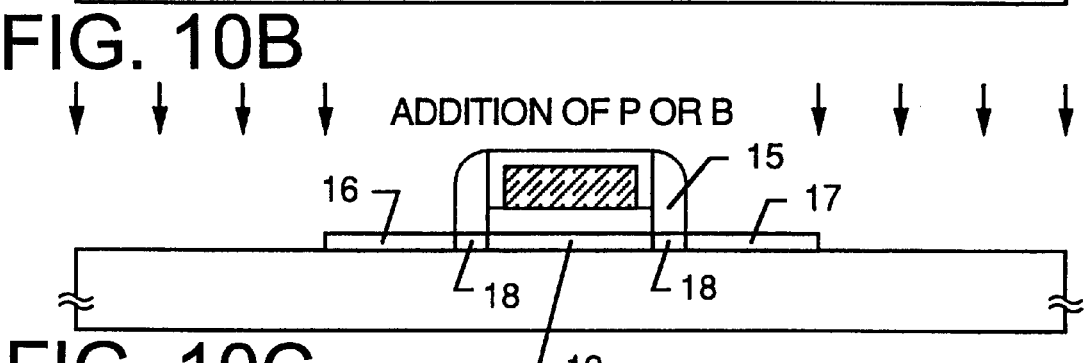

After the state of FIG. 10C has been obtained in the above manner, as in the first embodiment a heat treatment is performed at 450–650° C. (typically 600° C.) for 8–24 hours (typically 12 hours).

Although this heat treatment step is intended for gettering of the catalyst element (in this embodiment, nickel) by the element of phosphorus, at the same time the impurity is activated and the damage of the active layer that was caused at the time of ion implantation is repaired.

In this step, the heat treatment causes nickel atoms remaining in the channel forming region 19 to move to the source and drain regions 16 and 17, where they are gettered and inactivated. In this manner, nickel atoms remaining in the channel forming region 19 can be removed.

Since the source and drain regions 16 and 17 serve as electrodes if they are conductive, the presence/absence of nickel in those regions never influences the electrical characteristics. This is why the source and drain regions 16 and 17 can be used as gettering sites.

Figure 10D:
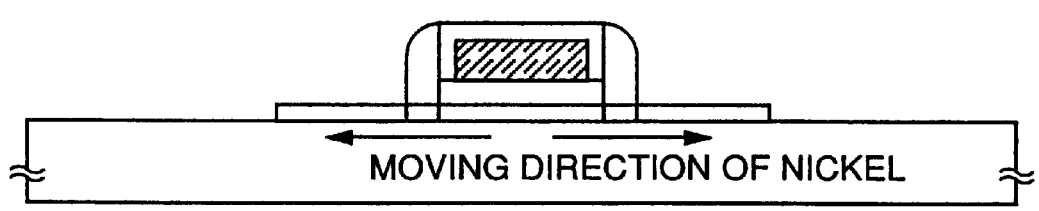
Figure 10E:
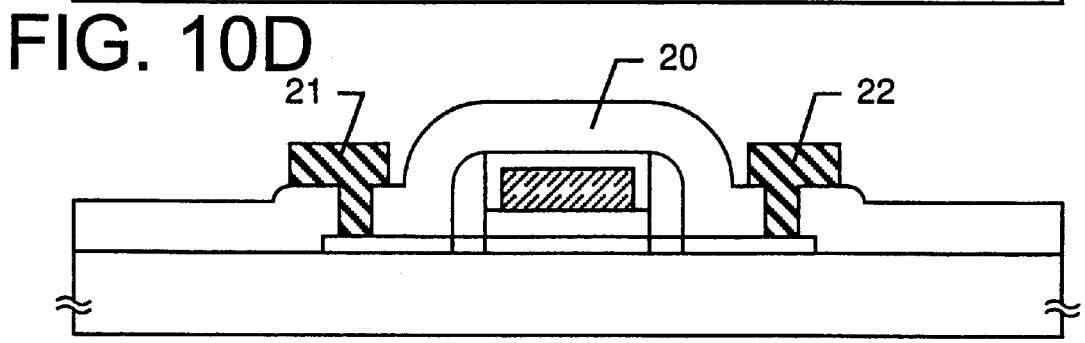

After the state of FIG. 10D has been obtained in the above manner, an interlayer insulating film 20, a source electrode 21, and a drain electrode 22 are formed to complete a thin-film transistor as shown in FIG. 10E.

Although in this embodiment the gate electrode is made of tantalum, it may be a conductive crystalline silicon film. Further, the method of forming low-concentration impurity regions is not limited to that of this embodiment.

The most important feature of this embodiment is that catalyst element atoms remaining in the channel forming region are moved to the source and drain regions and gettered there. This has been conceived by paying attention to the metal element gettering effect of phosphorus or arsenic.

This embodiment is directed to the case of an n-type TFT. In the case of a p-type TFT, it is necessary to add both elements of phosphorus and boron to the source and drain regions because no gettering effect is obtained only with the boron element.

Embodiment 5

This embodiment is directed to a case in which the invention is applied to a thin-film transistor having a different structure than in the first embodiment. This embodiment will be described with reference to FIGS. 11A–11E.

First, a gate electrode 32 is formed on a quartz substrate 31. It is necessary that the gate electrode 32 be a highly heat resistant electrode made of tantalum, silicon, or the like so that it will withstand a later thermal oxidation step.

Then, a gate insulating film 33 is formed so as to cover the gate electrode 32, and a 50-nm-thick amorphous silicon film 34 that will become an active layer is formed thereon. Then, after a mask insulating film 35 having an opening is formed in the same manner as in the first embodiment, a nickel containing layer 36 is formed (see FIG. 11A).

Figure 11A:
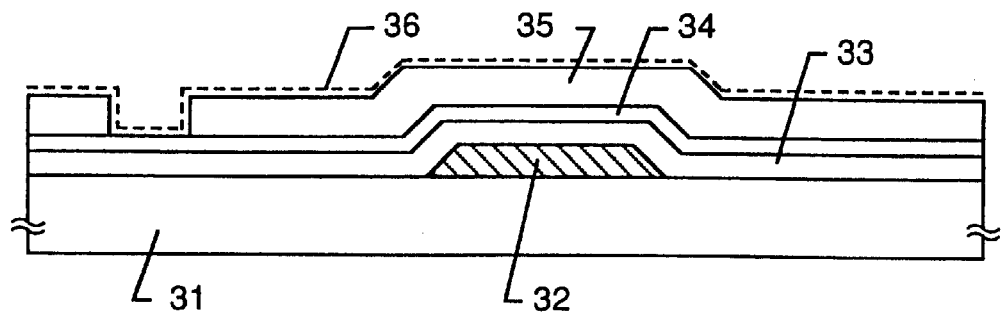
FIGS. 11A–11E show a manufacturing process of a thin-film transistor according to a fifth embodiment of the invention.
Figure 11B:
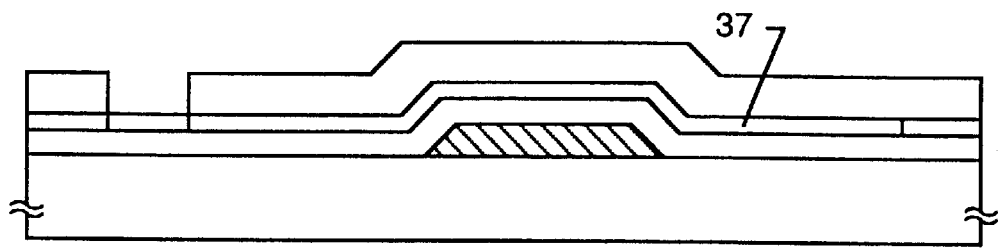
Figure 11C:
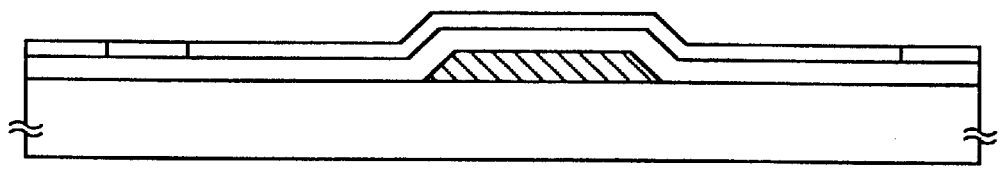

After the state of FIG. 11A has been obtained, a heat treatment for crystallization is performed to obtain a crystalline silicon film 37 that is a lateral growth region (see FIG. 11B).

Then, after the mask insulating film 35 is removed, a heat treatment is performed in an atmosphere containing a halogen element. The heat treatment conditions may be the same as in the first embodiment. In this step, nickel atoms are gettered, that is, they are removed from the crystalline silicon film 37 into the atmosphere (see FIG. 11C).

Figure 11D:
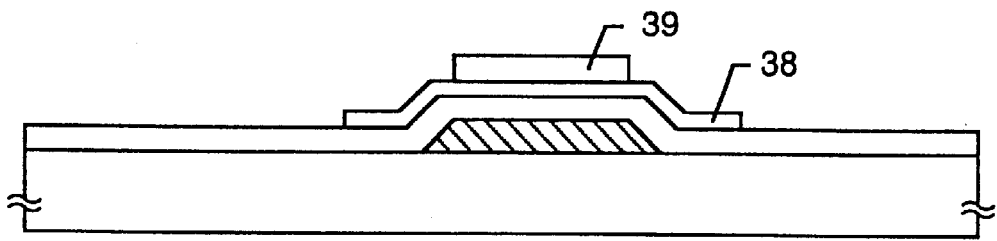

After the completion of the gettering process, an active layer 38 constituted of only a lateral growth region is formed by patterning and a silicon nitride film as a channel stopper 39 is formed thereon (see FIG. 11D).

After the state of FIG. 11D has been obtained, a crystalline silicon film having n-type conductivity is formed and then patterned into a source region 40 and a drain region 41. Further, a source electrode 42 and a drain electrode 43 are formed.

Figure 11E:
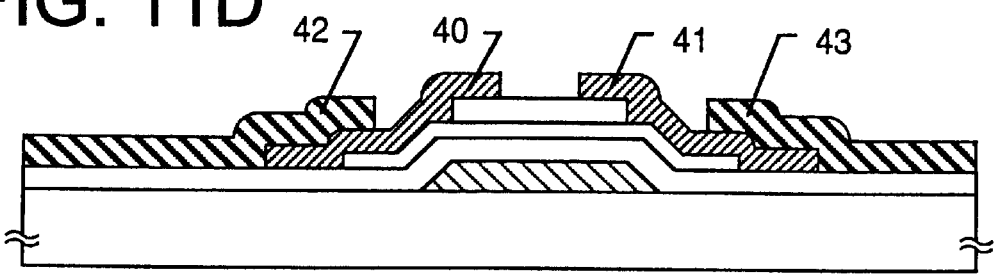

Finally, the entire device is subjected to a heat treatment in a hydrogen atmosphere, to complete an inverted staggered structure TFT as shown in FIG. 11E. The structure of this embodiment is one of various structures of the inverted staggered structure TFT and the invention is not limited to the structure of this embodiment. Further, the invention can also be applied to other bottom-gate TFTs.

Embodiment 6

This embodiment is directed to a case where a pixel matrix circuit and a peripheral circuit are constructed in a monolithic manner by forming TFTs of the invention on a substrate having an insulative surface. This embodiment will be described with reference to FIGS. 12A–12D to FIGS. 14A–14C. In this embodiment, a CMOS circuit is formed which is an example (basic circuit) of a peripheral circuit such as a driver circuit or a logic circuit.

Figure 12A:
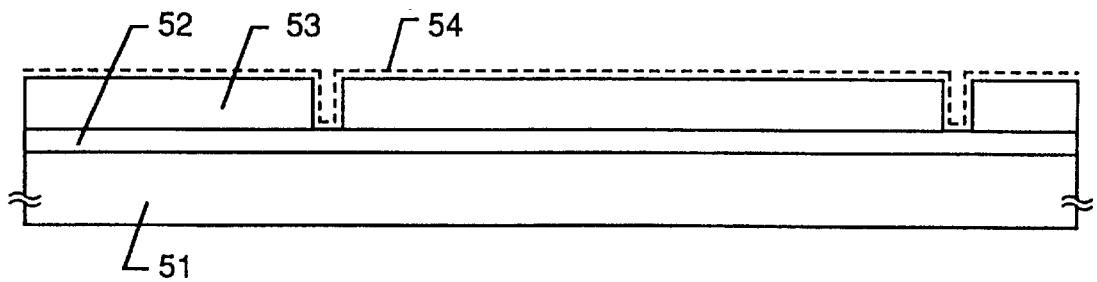
FIGS. 12A–12D, 13A–13D, and 14A–14C show a manufacturing process of an active matrix substrate according to a sixth embodiment of the invention.

First, a 75-nm-thick amorphous silicon film 52 and a mask insulating film 53 are formed on a quartz substrate 51 and a nickel containing layer 54 is formed by spin coating (see FIG. 12A). These steps are the same as in the first embodiment.

Figure 12B:
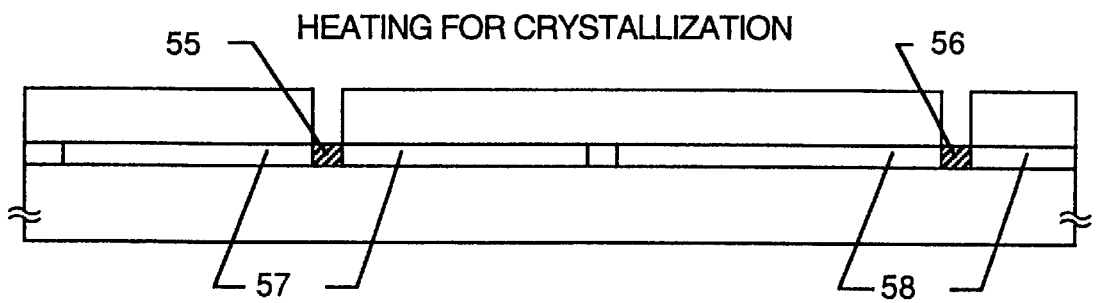

Then, after hydrogen removal is performed at 450° C. for about 1 hour, a heat treatment is performed at 590° C. for 8 hours in a nitrogen atmosphere, to obtain crystalline regions 55–58, that is, nickel adding regions 55 and 56 and lateral growth regions 57 and 58 (see FIG. 12B).

Figure 12C:
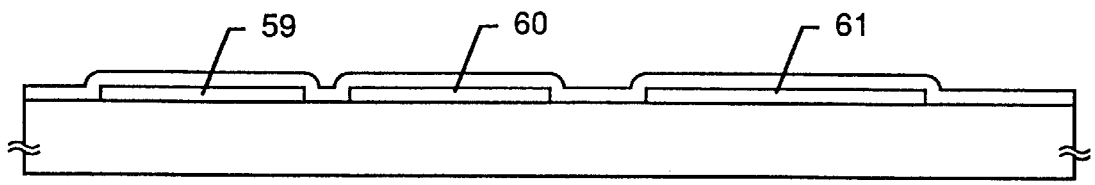
Figure 12D:
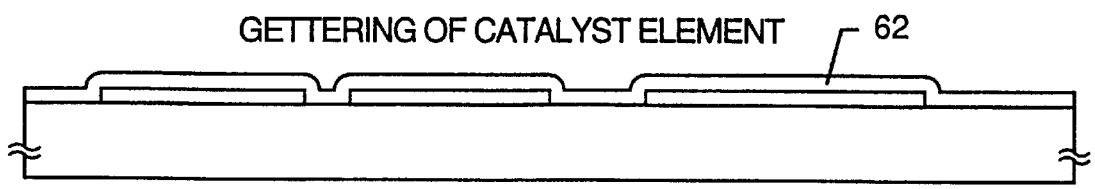

After completion of the heat treatment for crystallization, the mask insulating film 53 is removed and patterning is performed to form island-like semiconductor layers (active layers) 59–61 from only the lateral growth regions 57 and 58 (see FIG. 12C).

Reference numerals 59–61 denote the active layer of an n-type TFT to constitute a CMOS circuit, the active layer of a p-type TFT to constitute the CMOS circuit, and the active layer of an n-type TFT (pixel TFT) to constitute a pixel matrix circuit, respectively.

After the formation of the active layers 59–61, a gate insulating film 62 that is an insulating film containing silicon is formed thereon. Then, a catalyst element gettering process is executed under the same conditions as in the first embodiment (see FIG. 12D).

Figure 13A:
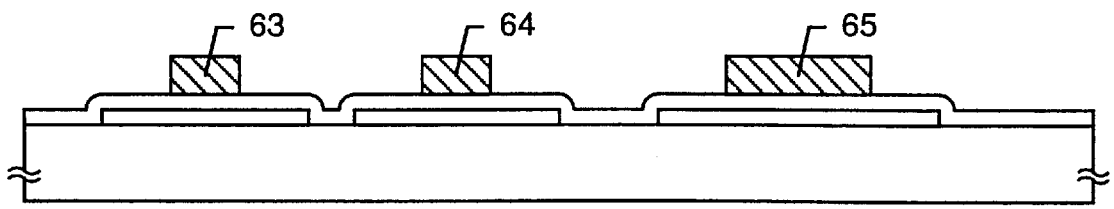

Thereafter, a metal film (not shown) having aluminum as the main component is formed and then patterned into gate electrode starting members 63–65 (see FIG. 13A). In this embodiment, an aluminum film containing scandium at 2 wt % is formed.

Figure 13B:
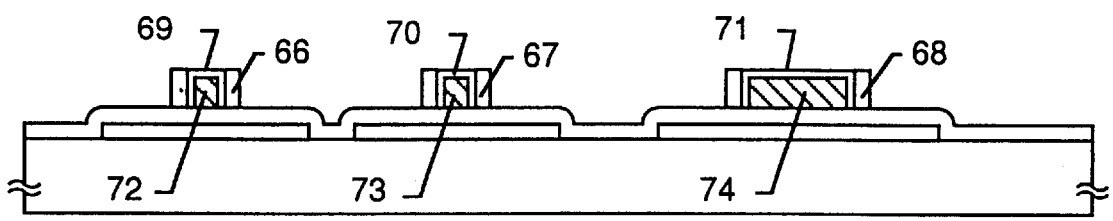

Then, porous anodic oxide films 66–68, non-porous anodic oxide films 69–71, and gate electrodes 72–74 are formed by the technique described in the publication No. 7-135318 in the same manner as in the first embodiment (see FIG. 13B).

Figure 13C:
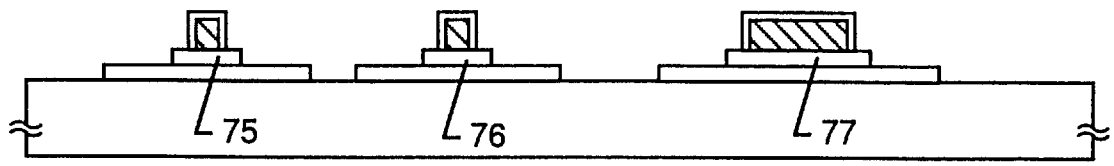

After the state of FIG. 13B has been obtained, the gate insulating film 62 is etched by using the gate electrodes 72–74 and the porous anodic oxide films 66–68 as a mask. The porous anodic oxide films 66–68 are then removed to obtain the state of FIG. 13C. In FIG. 13C, reference numerals 75–77 denote the gate insulating films after processing.

Then, impurity ions for imparting n-type conductivity are added in two steps in the same manner as in the first embodiment. n⁻ regions are formed by the first impurity addition that is performed at a high acceleration voltage and n⁺ regions are formed by the second impurity addition that is performed at a low acceleration voltage.

As a result of the execution of the above steps, a source region 78, a drain region 79, low-concentration impurity regions 80, and a channel forming region 81 of the n-type TFT constituted of the CMOS circuit are formed. Further, a source region 82, a drain region 83, low-concentration impurity regions 84, and a channel forming region 85 of the n-type TFT of the pixel TFT are defined (see FIG. 13D).

Figure 13D:
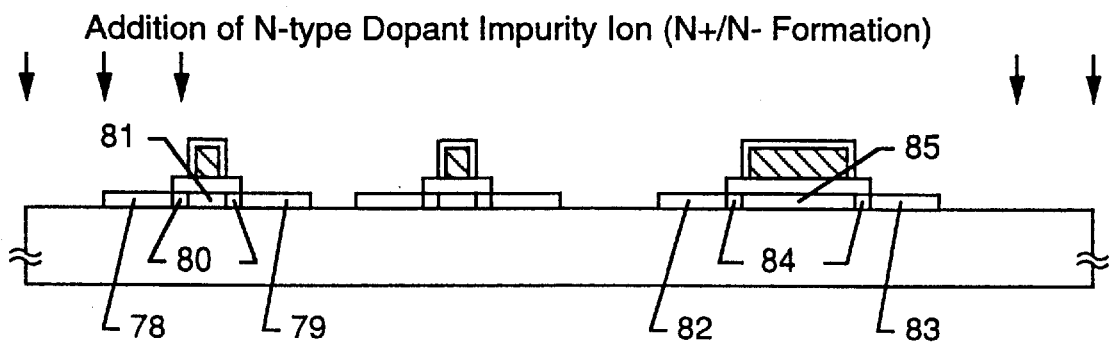

In the state of FIG. 13D, the active layer of the p-type TFT constituted of the CMOS circuit is in the same structure as that of the n-type TFT.

Then, after a resist mask 86 is formed so as to cover the n-type TFTs, impurity ions for imparting p-type conductivity (in this embodiment, boron ions) are added.

This step is performed in two steps as in the case of the above impurity adding step. However, because of the necessity for conductivity type inversion from the n-type to the p type, B (boron) ions are added at a concentration that is several times higher than the concentration of P ions in the above impurity adding step.

Figure 14A:
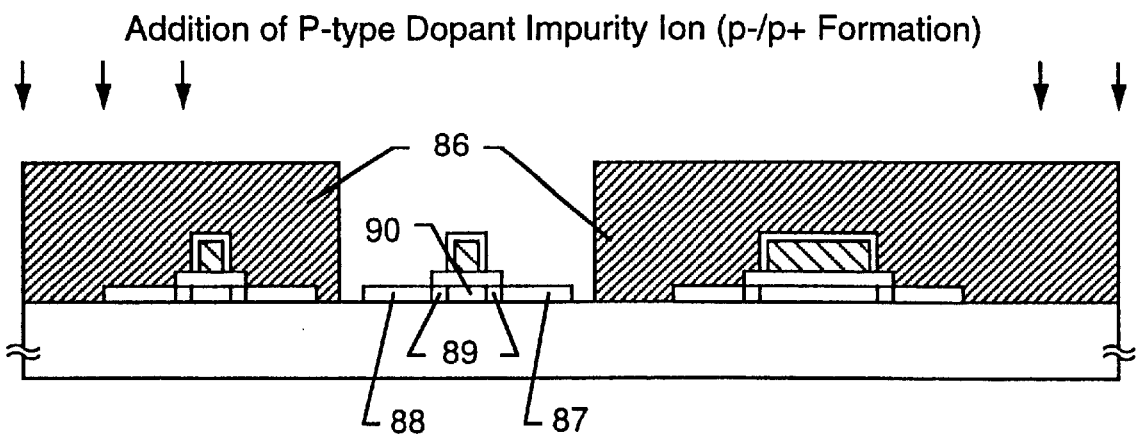

A source region 87, a drain region 88, low-concentration impurity regions 89, and a channel forming region 90 of the p-type TFT constituted of the CMOS circuit are thus formed (see FIG. 14A).

After the active layers have been completed in the above manner, the impurity ions are activated by a combination of furnace annealing, laser annealing, lamp annealing, etc. At the same time, damage of the active layers that was caused in the impurity adding steps is repaired.

Figure 14B:
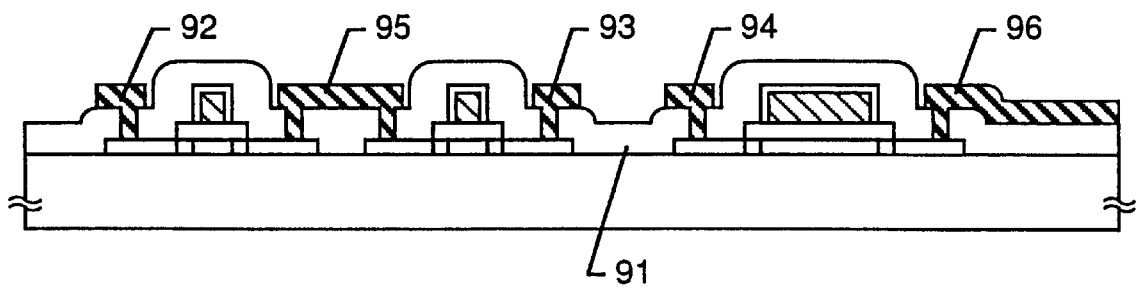

Then, a multilayered film of a silicon oxide film and a silicon nitride film is formed as an interlayer insulating film 91. After contact holes are formed, source electrodes 92–94 and drain electrodes 95 and 96 are formed. The state of FIG. 14B is thus obtained.

In this embodiment, the drain electrode 96 of the pixel TFT will be used as a bottom electrode of an auxiliary capacitor. Therefore, the drain electrode 96 needs to be shaped so as to be suitable for that purpose.

Then, a silicon nitride film 97 is formed at a thickness of 10–50nm and a capacitor electrode 98 for forming the auxiliary capacitor is formed thereon at a thickness of 100 nm. In this embodiment, a titanium film is used as the capacitor electrode 98 and the auxiliary capacitor is formed between the capacitor electrode 98 and the drain electrode 96.

Having large relative permittivity, the silicon nitride film 97 is suitable for use as a dielectric. An aluminum film, a chromium film, or the like may be used, instead of a titanium film, as the capacitor electrode 98.

Since this embodiment is directed to the case of producing an active matrix substrate (TFT-side substrate) of a reflection-type liquid crystal display device, the portion under a pixel electrode that will be formed later can be used freely (without the need for considering the aperture ratio) in contrast to the case of a transmission type device. This is the reason why the above auxiliary capacitor can be formed.

Then, an organic resin film as a second interlayer insulating film 99 is formed at a thickness of 0.5–3 μm. An conductive film is formed on the interlayer insulating film 99 and then patterned into a pixel electrode 100. Since this embodiment is directed to the reflection-type device, the conductive film to constitute the pixel electrode 100 is made of a material having aluminum as the main component so as to give the pixel electrode 100 a function of a reflection film.

Then, the entire substrate is heated at 350° C. for 1–2 hours in a hydrogen atmosphere to hydrogenate the entire device, whereby dangling bonds in the films (particularly in the active layers) are compensated for. As a result of the above steps, the CMOS circuit and the pixel matrix circuit are produced on the same substrate.

Embodiment 7

This embodiment is directed to the cases where TFT structures different from the sixth embodiment are employed. First, FIG. 15A shows a case where sidewalls are used to form low-concentration impurity regions.

In this case, non-porous anodic oxide films are formed in the state of FIG. 13A and the gate insulating film is etched by using the gate electrodes and their anodic oxide films as a mask. In this state, impurities are added to form n⁻ and p⁻ regions.

Then, after sidewalls 1001–1003 are formed by etch back, impurities are added to form n⁺ and p⁺ regions. As a result of these steps, low-concentration impurity regions (n⁻ and p⁻ regions) are formed under the sidewalls 1001–1003.

Figure 15A:
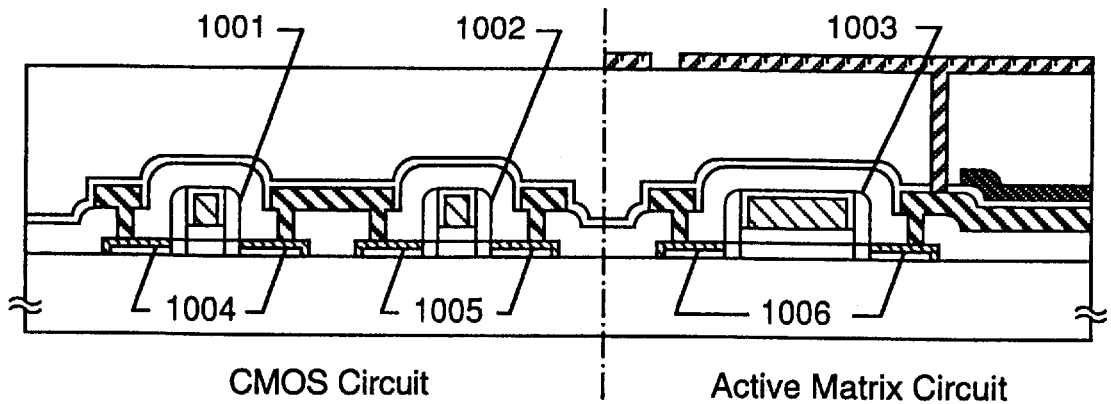
FIGS. 15A and 15B show configurations of active matrix substrates according to a seventh embodiment of the invention.

Further, in the configuration of FIG. 15A, metal silicide films 1004–1006 are formed by utilizing a known salicide technique. Examples of metals to be silicified are titanium, tantalum, tungsten, and molybdenum.

Figure 15B:
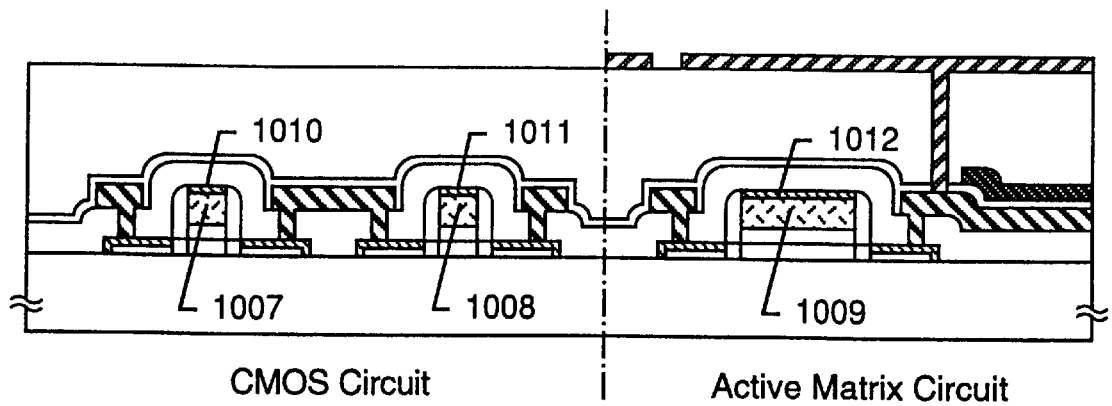

On the other hand, a configuration of FIG. 15B has a feature that gate electrodes 1007–1009 are crystalline silicon films that are given one conductivity type. While usually they are given n-type conductivity, dual-gate TFTs may be formed in which an n-type TFT and a p-type TFT are given different conductivity types.

A salicide structure is also employed in the configuration of FIG. 15B. In this case, metal silicide films 1010–1012 are also formed on the respective gate electrodes 1007–1009.

The configurations of this embodiment are designed so as to be suitable to provide TFTs having high operation speed. In particular, the salicide structure is very effective in realizing an operation frequency as high as several gigahertz.

Embodiment 8

This embodiment is directed to the cases where an auxiliary capacitor has a different structure from the sixth embodiment.

Figure 16A:
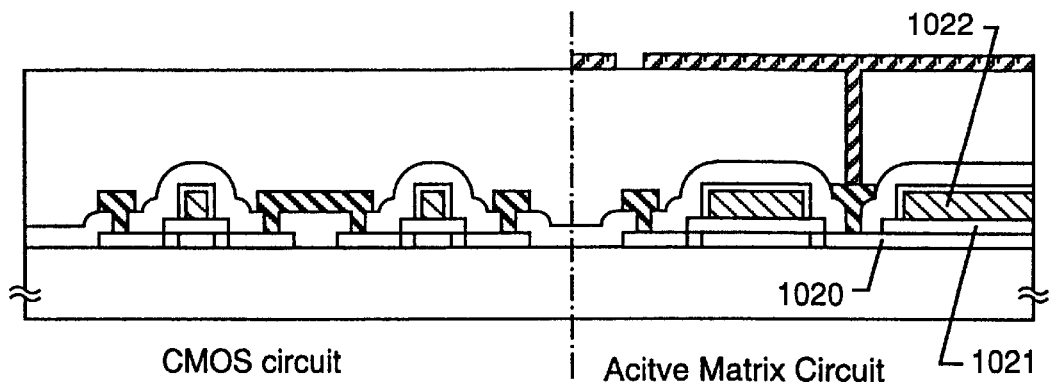
FIGS. 16A and 16B show configurations of active matrix substrates according to an eighth embodiment of the invention.

First, in the case of FIG. 16A, a drain region 1020 of an active layer is formed so as to be wider than the necessary area and a part of the drain region 1020 is used as the bottom electrode of an auxiliary capacitor. In this case, a gate insulating film 1021 exists on the drain region 1020 and a capacitor electrode 1022 is formed thereon. The capacitor electrode 1022 is made of the same material as the gate electrodes.

The portion of the drain region 1020 that is used to form the auxiliary capacitor may be rendered conductive in advance by adding an impurity to that portion. Alternatively, an inversion layer that is formed when a constant voltage is applied to the capacitor electrode 1022 may be utilized.

Since a reflection-type liquid crystal display device is formed in the case of FIG. 16A, the auxiliary capacitor can be formed by fully utilizing the portion on the back side of the pixel electrode, which enables a large capacitance to be secured. Although the structure of FIG. 16A can be also applied to a transmission-type liquid crystal display device, in such a case, care should be taken because the aperture ratio decreases if the area occupied by the auxiliary capacitor is too large.

Figure 16B:
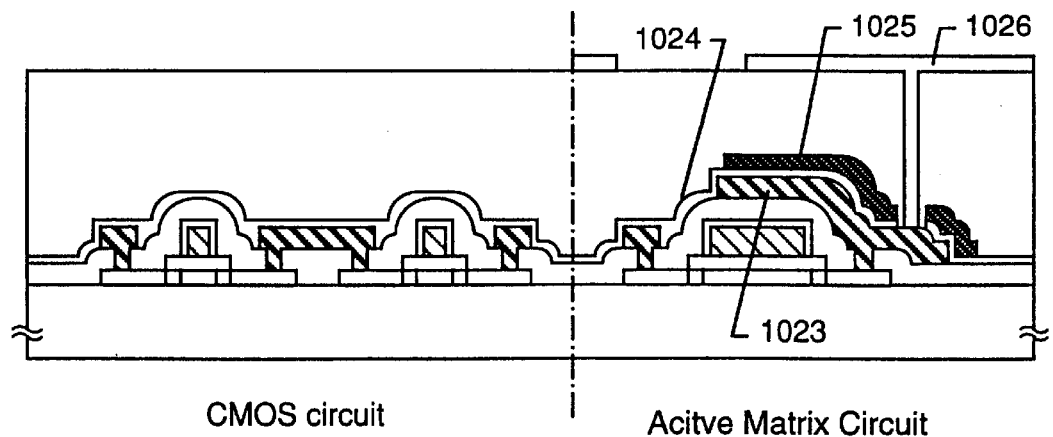

On the other hand, FIG. 16B shows a case of forming a transmission-type liquid crystal display device. In the structure of FIG. 16B, a drain electrode 1023 is used as the bottom electrode of an auxiliary capacitor and a silicon nitride film 1024 and a black mask 1025 are formed thereon. The auxiliary capacitor is formed between the drain electrode 1023 and the black mask 1025.

As described above, the structure of FIG. 16B has a feature that the black mask 1025 also serves as the top electrode of the auxiliary capacitor.

Because of the transmission-type device, a pixel electrode 1026 is a transparent conductive film (for instance, an ITO film).

In the structure of FIG. 16B, the aperture ratio can be increased by forming the auxiliary capacitor, which tends to occupy a large area, on the TFT. Further, since a silicon nitride film having large relative permittivity can be used in such a manner as to be as thin as 25 nm, a very large capacitance can be secured in a small area.

Embodiment 9

Figure 17:
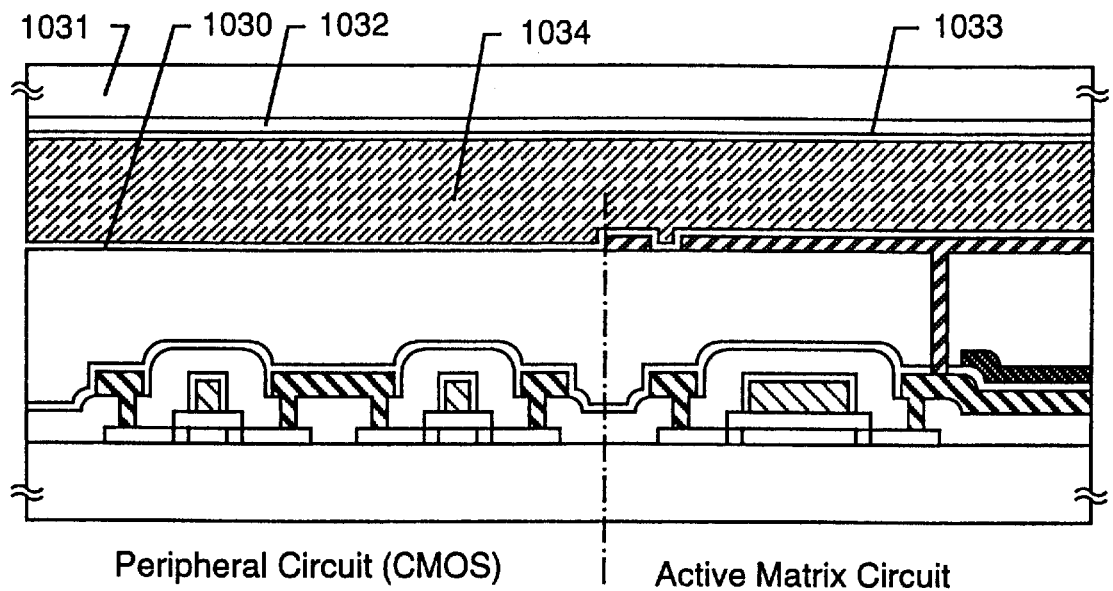
FIG. 17 is a sectional view showing a liquid crystal device according to a ninth embodiment of the invention.

This embodiment is directed to a case where a liquid crystal panel is constructed by utilizing the invention. FIG. 17 is a simplified sectional view of an active matrix liquid crystal panel. A CMOS circuit is formed in an area where a driver circuit or a logic circuit is to be constructed and a pixel TFT is formed in an area where a pixel matrix circuit is to be constructed.

Since the configurations of the CMOS circuit and the pixel matrix circuit (TFT structure) have already been described in the sixth to eighth embodiments, only necessary points will be described in this embodiment.

Figure 14C:
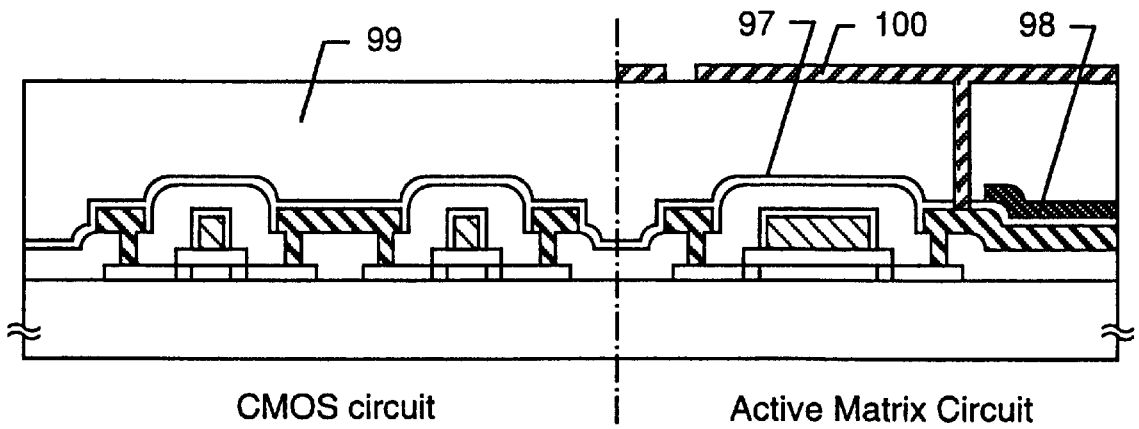

First, the state of FIG. 14C is obtained by the manufacturing steps of the sixth embodiment. Modifications such as employing a multi-gate pixel TFT may be made, as desired, by a party who will practice the invention.

Then, an orientation film 1030 is formed as a necessary preparation to be made on the active matrix substrate side.

Then, an opposed substrate is prepared, which is composed of a glass substrate 1031, a transparent conductive film 1032, and an orientation film 1033. When necessary, a black mask or color filters are formed on the opposed substrate side. They are omitted in this embodiment.

The active matrix substrate and the opposed substrate thus prepared are bonded to each other by a known cell assembling step. A liquid crystal material 1034 is sealed into the space between the two substrates, to complete a liquid crystal panel as shown in FIG. 17.

The kind of the liquid crystal material 1034 may be selected freely in accordance with the liquid crystal operation mode (the ECB mode, the guest-host mode, or the like).

Figure 18:
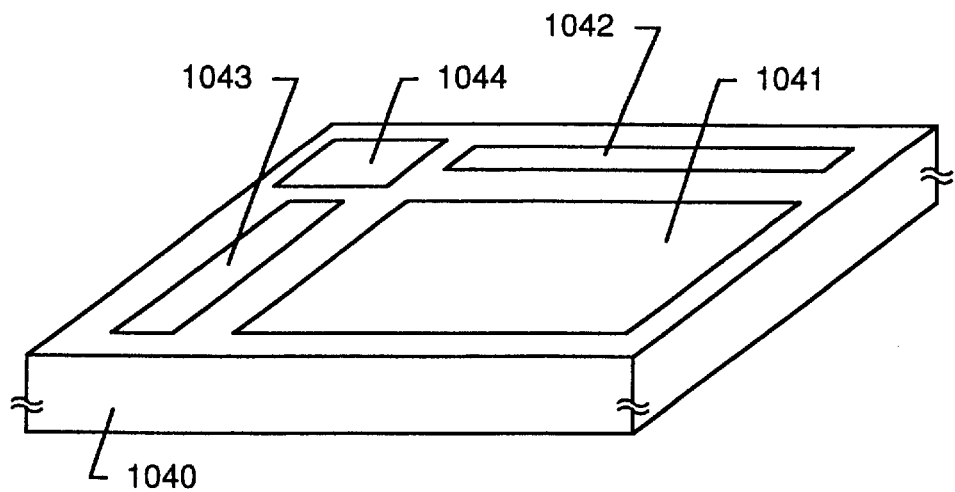
FIG. 18 is a perspective view of an active matrix substrate according to the ninth embodiment.

FIG. 18 shows, in a simplified manner, an appearance of an active matrix substrate as shown in FIG. 14C. In FIG. 18, reference numeral 1040 denotes a quartz substrate; 1041, a pixel matrix circuit; 1042, a source driver circuit; 1043, a gate driver circuit; and 1044, a logic circuit.

Although in a broad sense the logic circuit 1044 includes every kind of logic circuit that is constituted of TFTs, in this embodiment it is distinguished from circuits that are conventionally called a pixel matrix circuit and a driver circuit and means other signal processing circuits (a memory, a D/A converter, a pulse generator, etc.)

FPC (flexible print circuit) terminals as external terminals are attached to the liquid crystal panel thus produced. What is commonly called a liquid crystal module is a liquid crystal panel to which FPC terminals are attached.

Embodiment 10

In addition to a liquid crystal display device as described in the ninth embodiment, other electro-optical devices such as an active matrix EL (electro luminescence) display device and an EC (electro chromic) display device can be constructed according to the invention.

Embodiment 11

In this embodiment, examples of electronic devices (application products) using an electro-optical device according to the invention will be described with reference to FIGS. 19A–19F. Examples of application products utilizing the invention are a video camera, a still camera, a projector, a head-mounted display, a car-navigation system, a personal computer, and portable information terminals (a mobile computer, a cellular telephone, etc.).

Figure 19A:
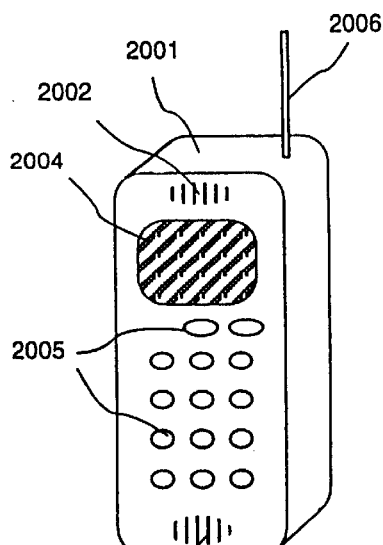
FIGS. 19A–19F show examples of electronic devices (application products) according to an 11th embodiment of the invention.

FIG. 19A shows a cellular telephone, which is composed of a main body 2001, a voice output section 2002, a voice input section 2003, a display device 2004, manipulation switches 2005, and an antenna 2006. The invention can be applied to the display device 2004.

Figure 19B:
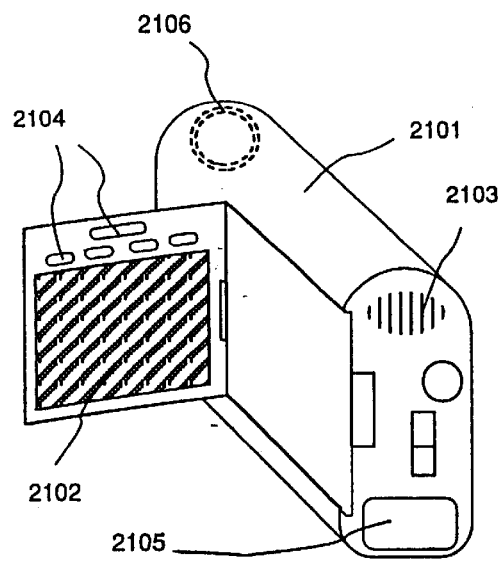

FIG. 19B shows a video camera, which is composed of a main body 2101, a display device 2102, a sound input section 2103, manipulation switches 2104, a battery 2105, and an image receiving section 2106. The invention can be applied to the display device 2102.

Figure 19C:
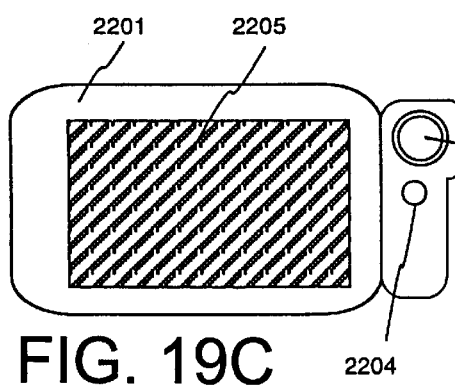

FIG. 19C shows a mobile computer, which is composed of a main body 2201, a camera section 2202, an image receiving section 2203, a manipulation switch 2204, and a display device 2205. The invention can be applied to the display device 2205.

Figure 19D:
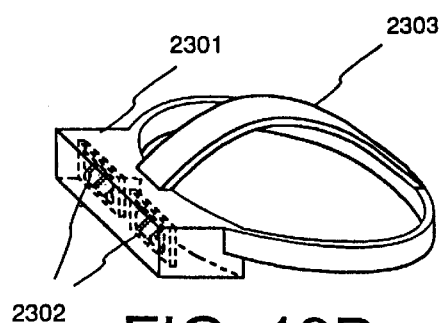

FIG. 19D shows a head-mounted display, which is composed of a main body 2301, display devices 2302, and a band section 2303. The invention can be applied to the display devices 2302.

Figure 19E:
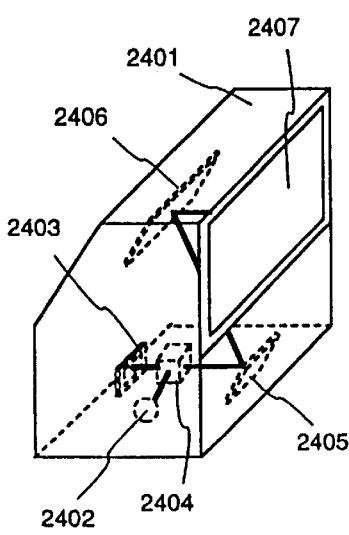

FIG. 19E shows a rear projector, which is composed of a main body 2401, a light source 2402, a display device 2403, a polarizing beam splitter 2404, reflectors 2405 and 2406, and a screen 2407. The invention can be applied to the display device 2403.

Figure 19F:
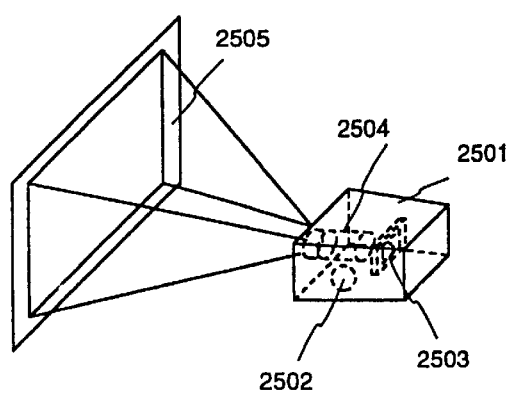

FIG. 19F shows a front projector, which is composed of a main body 2501, a light source 2502, a display device 2503, an optical system 2504, and a screen 2505. The invention can be applied to the display device 2503.

As described above, the invention has an extremely wide application range and can be applied to display media of every field. Further, since the TFT of the invention can also be used to construct semiconductor circuits such as ICs and LSIs, the invention can be applied to a product of any use as long as it requires such a semiconductor circuit.

The invention enables formation of a semiconductor thin film whose crystallinity is substantially equivalent to that of a single crystal semiconductor, and makes it possible to realize, by using such a semiconductor thin film, a TFT exhibiting high performance that is equivalent to or even higher than the performance of an IGFET (MOSFET) formed on a single crystal.

A semiconductor circuit and an electro-optical device that are formed by using TFTs of the above kind, and an electronic device incorporating such a semiconductor circuit or an electro-optical device have extremely high performance and are products that are much superior in functionality, portability, and reliability.

What is claimed is:

1. A semiconductor thin film which is a collected body of a plurality of rod-like or flat-rod-like crystals, wherein:

surface orientation is approximately equal to {110} orientation; and almost all of crystal lattices have continuity at any crystal boundary.

2. The semiconductor thin film according to claim 1, wherein an electron beam diffraction pattern of the semiconductor thin film has particular regularity due to the {110} orientation.

3. The semiconductor thin film according to claim 1, wherein any of the rod-like or flat-rod-like crystals has been formed by crystal growth that proceeded approximately in a <111> axis direction with a head surface that is approximately equal to a {111} plane.

4. The semiconductor thin film according to claim 1, wherein the rod-like or flat-rod-like crystals are arranged approximately parallel with each other with particular directivity.

5. The semiconductor thin film according to claim 1, wherein a concentration of each of C, N, O, and S in the semiconductor thin film is less than $5\times10^{18}$ atoms/cm$^3$.

6. The semiconductor thin film according to claim 1, wherein the semiconductor thin film contains one or a plurality of elements selected from the group consisting of Ni, Co, Fe, Pd, Pt, Cu, Au, and Ge.

7. The semiconductor thin film according to claim 1, wherein the semiconductor thin film is made of silicon or a compound having silicon as a main component.

8. An insulated-gate semiconductor device in which at least a channel forming region is constituted of a semiconductor thin film that is a collected body of a plurality of rod-like or flat-rod-like crystals, wherein:

surface orientation of the semiconductor thin film is approximately equal to a {110} orientation; and more than 90% of crystal lattices of the semiconductor thin film have continuity at any crystal boundary.

9. The semiconductor device according to claim 8, wherein an electron beam diffraction pattern of the semiconductor thin film has particular regularity due to the {110} orientation.

10. The semiconductor device according to claim 8, wherein any of the rod-like or flat-rod-like crystals has been formed by crystal growth that proceeded approximately in a <111> axis direction with a head surface that is approximately equal to a {111} plane.

11. The semiconductor device according to claim 8, wherein the rod-like or flat-rod-like crystals are arranged approximately parallel with each other with particular directivity.

12. The semiconductor device according to claim 8, wherein a concentration of each of C, N, O, and S in the semiconductor thin film is less than $5 \times 10^{18}$ atoms/cm$^3$.

13. The semiconductor device according to claim 8, wherein the semiconductor thin film contains one or a plurality of elements selected from the group consisting of Ni, Co, Fe, Pd, Pt, Cu, Au, and Ge.

14. The semiconductor device according to claim 8, wherein the as a semiconductor thin film is made of silicon or a compound having silicon main component.

15. An insulated-gate semiconductor device in which at least a channel forming region is constituted of a semiconductor thin film that is a collected body of a plurality of rod-like or flat-rod-like crystals, wherein:
   surface orientation of the semiconductor thin film is approximately equal to a {110} orientation; and
   more than 90% of lattice fringes of the semiconductor thin film that are detected so as to traverse any grain boundary of different crystal grains extend straight and are continuous at said grain boundary.

16. An insulated-gate semiconductor device in which at least a channel forming region is constituted of a semiconductor thin film that is a collected body of a plurality of rod-like or flat-rod-like crystals, wherein:
   a {110} orientation ratio of the semiconductor thin film by an X-ray diffraction measurement is 0.9 or more; and
   more than 90% of crystal lattices of the semiconductor thin film have continuity at any crystal boundary.

17. An insulated-gate semiconductor device in which at least a channel forming region is constituted of a semiconductor thin film that is a collected body of a plurality of rod-like or flat-rod-like crystals, wherein:
   a {110} orientation ratio of the semiconductor thin film by an X-ray diffraction measurement is 0.9 or more; and
   more than 90% of lattice fringes of the semiconductor thin film that are detected so as to traverse any grain boundary of different crystal grains extend straight and are continuous at said grain boundary.

18. A semiconductor device having at least one insulated gate field effect thin film transistor on an insulating surface, said thin film transistor comprising:
   a semiconductor film comprising crystalline silicon having a surface orientation approximately equal to a {110} orientation,
   wherein more than 90% of lattice fringes that are detected so as to traverse any grain boundary of different crystal grains extend straight and are continuous at said grain boundary.

19. The semiconductor thin film according to claim 18, wherein an electron beam diffraction pattern of the semiconductor thin film has particular regularity due to the {110} orientation.

20. The semiconductor thin film according to claim 18, wherein the semiconductor thin film contains one or a plurality of elements selected from the group consisting of Ni, Co, Fe, Pd, Pt, Cu, Au, and Ge.

21. The semiconductor device according to claim 18 wherein said semiconductor device is an electroluminescence display device.

22. The semiconductor device according to claim 18 wherein said semiconductor device is a cellular telephone.

23. The semiconductor device according to claim 18 wherein said semiconductor device is a video camera.

24. The semiconductor device according to claim 18 wherein said semiconductor device is a head-mount display.

25. The semiconductor device according to claim 18 wherein said semiconductor device is a projector.

26. A semiconductor device having at least one insulated gate field effect thin film transistor formed over a substrate, said thin film transistor comprising:
   a semiconductor film comprising crystalline silicon,
   wherein a {110} orientation ratio of the semiconductor film by an X-ray diffraction measurement is 0.9 or more, and more than 90% of crystal lattices have continuity at any crystal boundary.

27. The semiconductor thin film according to claim 26, wherein an electron beam diffraction pattern of the semiconductor thin film has particular regularity due to the {110} orientation.

28. The semiconductor thin film according to claim 26, wherein a concentration of each of C, N, O, and S in the semiconductor thin film is less than $5 \times 10^{18}$ atoms/cm$^3$.

29. The semiconductor thin film according to claim 26, wherein the semiconductor thin film contains one or a plurality of elements selected from the group consisting of Ni, Co, Fe, Pd, Pt, Cu, Au, and Ge.

30. The semiconductor device according to claim 26 wherein said semiconductor device is an electroluminescence display device.

31. The semiconductor device according to claim 26 wherein said semiconductor device is a cellular telephone.

32. The semiconductor device according to claim 26 wherein said semiconductor device is a video camera.

33. The semiconductor device according to claim 26 wherein said semiconductor device is a head-mount display.

34. The semiconductor device according to claim 26 wherein said semiconductor device is a projector.

35. A semiconductor device having at least one insulated gate field effect transistor formed over a substrate, said transistor comprising:
   a semiconductor thin film comprising silicon and having a plurality of rod-like or flat rod-like crystals,
   wherein a {110} orientation ratio of the semiconductor film by an X-ray diffraction measurement is 0.9 or more, and more than 90% of lattice fringes that are detected so as to traverse any grain boundary of different crystal grains extend straight and are continuous at said grain boundary.

36. The semiconductor thin film according to claim 35, wherein an electron beam diffraction pattern of the semiconductor thin film has particular regularity due to the {110} orientation.

37. The semiconductor thin film according to claim 35, wherein any of the rod-like or flat-rod-like crystals has been formed by crystal growth that proceeded approximately in a <111> axis direction with a head surface that is approximately equal to a {111} plane.

38. The semiconductor thin film according to claim 35, wherein the rod-like or flat-rod-like crystals are arranged approximately parallel with each other with particular directivity.

39. The semiconductor thin film according to claim 35, wherein the semiconductor thin film contains one or a plurality of elements selected from the group consisting of Ni, Co, Fe, Pd, Pt, Cu, Au, and Ge.

40. The semiconductor device according to claim 35 wherein said semiconductor device is an electroluminescence display device.

41. The semiconductor device according to claim 35 wherein said semiconductor device is a cellular telephone.

42. The semiconductor device according to claim 35 wherein said semiconductor device is a video camera.

43. The semiconductor device according to claim 35 wherein said semiconductor device is a head-mount display.

44. The semiconductor device according to claim 35 wherein said semiconductor device is a projector.

45. The semiconductor device according to claim 8 wherein said semiconductor device is an electroluminescence display device.

46. The semiconductor device according to claim 8 wherein said semiconductor device is a cellular telephone.

47. The semiconductor device according to claim 8 wherein said semiconductor device is a video camera.

48. The semiconductor device according to claim 8 wherein said semiconductor.

49. The semiconductor device according to claim 8 wherein said semiconductor device is a projector.

50. The semiconductor device according to claim 15, 16 or 17 wherein said semiconductor device is an electroluminescence display device.

51. The semiconductor device according to claim 15, 16 or 17 wherein said semiconductor device is a cellular telephone.

52. The semiconductor device according to claim 15, 16 or 17 wherein said semiconductor device is a video camera.

53. The semiconductor device according to claim 15, 16 or 17 wherein said semiconductor device is a head-mount display.

54. The semiconductor device according to claim 15, 16 or 17 wherein said semiconductor device is a projector.

55. The semiconductor device according to claim 8 wherein said semiconductor thin film comprises $Si_xGe_{(1-X)}$.

56. The semiconductor device according to claim 55 wherein said X is in a range from 0.9 to 0.99.

57. The semiconductor device according to claim 15 wherein said semiconductor thin film comprises $Si_xGe_{(1-X)}$.

58. The semiconductor device according to claim 57 wherein said X is in a range from 0.9 to 0.99.

59. The semiconductor device according to claim 16 wherein said semiconductor thin film comprises $Si_xGe_{(1-X)}$.

60. The semiconductor device according to claim 59 wherein said X is in a range from 0.9 to 0.99.

61. The semiconductor device according to claim 17 wherein said semiconductor thin film comprises $Si_xGe_{(1-x)}$.

62. The semiconductor device according to claim 61 wherein said X is in a range from 0.9 to 0.99.

* * * * *